United States Patent [19]
Yamada et al.

[11] Patent Number: 5,083,173
[45] Date of Patent: Jan. 21, 1992

[54] CHARGE COUPLED DEVICE FOR A SOLID STATE IMAGE PICK-UP DEVICE

[75] Inventors: Takahiro Yamada, Hirakata; Sumio Terakawa, Ibaraki, both of Japan

[73] Assignees: Matsushita Electronics Corporation; Matsushita Electric Industrial Co., Ltd., both of Kadoma, Japan

[21] Appl. No.: 628,940

[22] Filed: Dec. 14, 1990

Related U.S. Application Data

[63] Continuation of Ser. No. 128,119, Nov. 30, 1987, abandoned.

[30] Foreign Application Priority Data

Nov. 28, 1986 [JP] Japan ............................ 61-284759

[51] Int. Cl.⁵ .................... H01L 29/78; H01L 27/14; H01L 29/06
[52] U.S. Cl. ........................ 357/24; 357/30; 357/49; 357/55
[58] Field of Search ............... 357/24 LR, 24, 24 M, 357/20, 30 D, 30 H, 49, 55

[56] References Cited

U.S. PATENT DOCUMENTS

| | | | |
|---|---|---|---|
| 4,190,851 | 2/1980 | Finnila et al. | 357/24 LR |
| 4,586,084 | 4/1986 | Imai | 357/24 LR |
| 4,717,945 | 1/1988 | Yusa et al. | 357/24 LR |
| 4,760,273 | 7/1988 | Kimata | 357/24 LR |
| 4,814,840 | 3/1987 | Kameda | 357/55 |
| 4,814,848 | 3/1989 | Akimoto et al. | 357/24 LR |

FOREIGN PATENT DOCUMENTS

| | | | |
|---|---|---|---|
| 55-1136 | 1/1980 | Japan | 357/24 |
| 55-121678 | 9/1980 | Japan | 357/24 M |
| 59-113661 | 6/1984 | Japan | 357/24 LR |
| 61-289659 | 12/1986 | Japan | 357/24 LR |
| 62-51254 | 3/1987 | Japan | 357/24 LR |
| 63-155759 | 6/1988 | Japan | 357/24 LR |

OTHER PUBLICATIONS

P. K. Weimer, Image Sensors for Solid State Cameras, pp. 181-225.
Carlo H. Seqin and Michael F. Tompsett, Charge Transfer Devices, Advances in Electronics and Electron Physics, pp. 7-15, 42-47, 152-165.

Primary Examiner—Andrew J. James
Assistant Examiner—Ngan Van Ngo
Attorney, Agent, or Firm—Cushman, Darby & Cushman

[57] ABSTRACT

Signal charge conveying regions are made as oblong depletion regions which are formed in operation state along and at the vicinity of side walls of a trench or groove in a seimconductor imaging device, thereby improving resolution power, dynamic range, sensitivity and S/N characteristics are improved.

1 Claim, 34 Drawing Sheets

FIG. 1 (Prior Art-I)
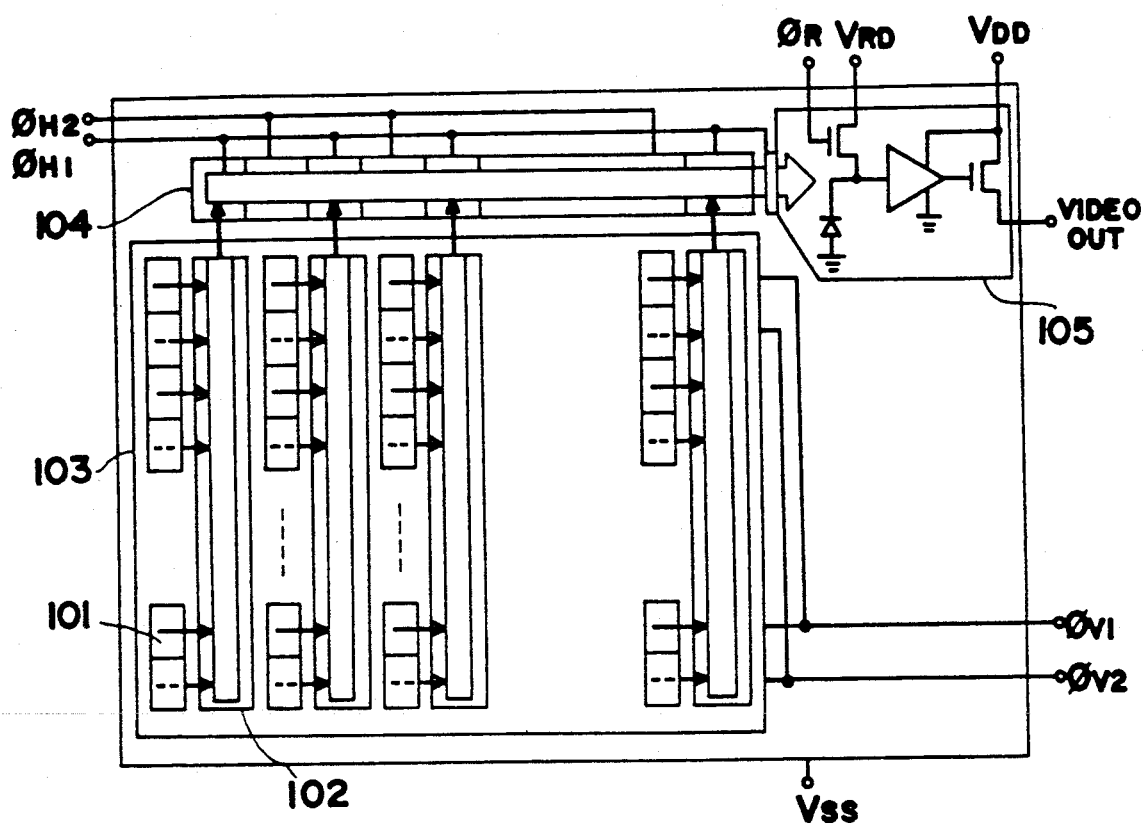
FIG. 2 (Prior Art-I)
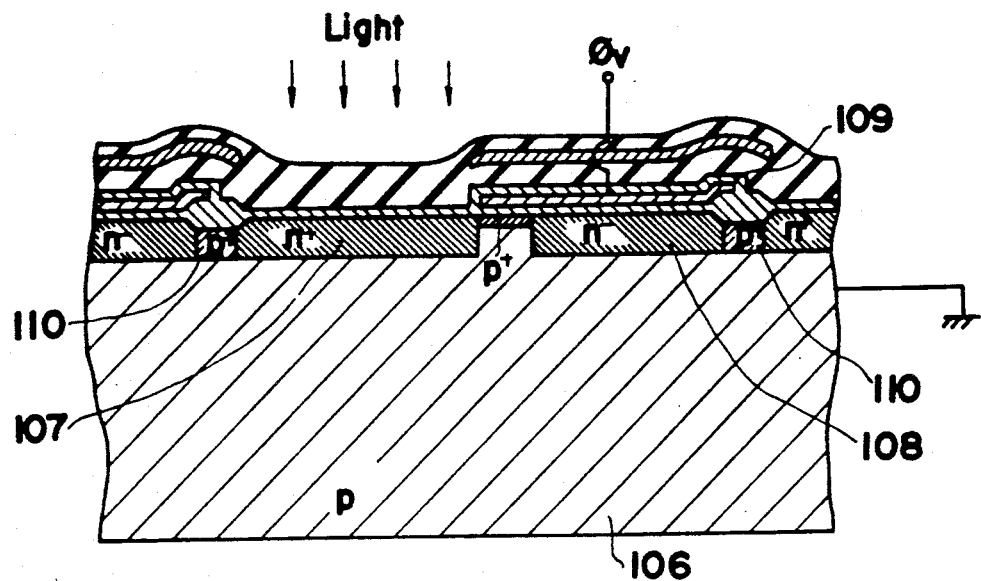

FIG.3 (Prior Art-2)
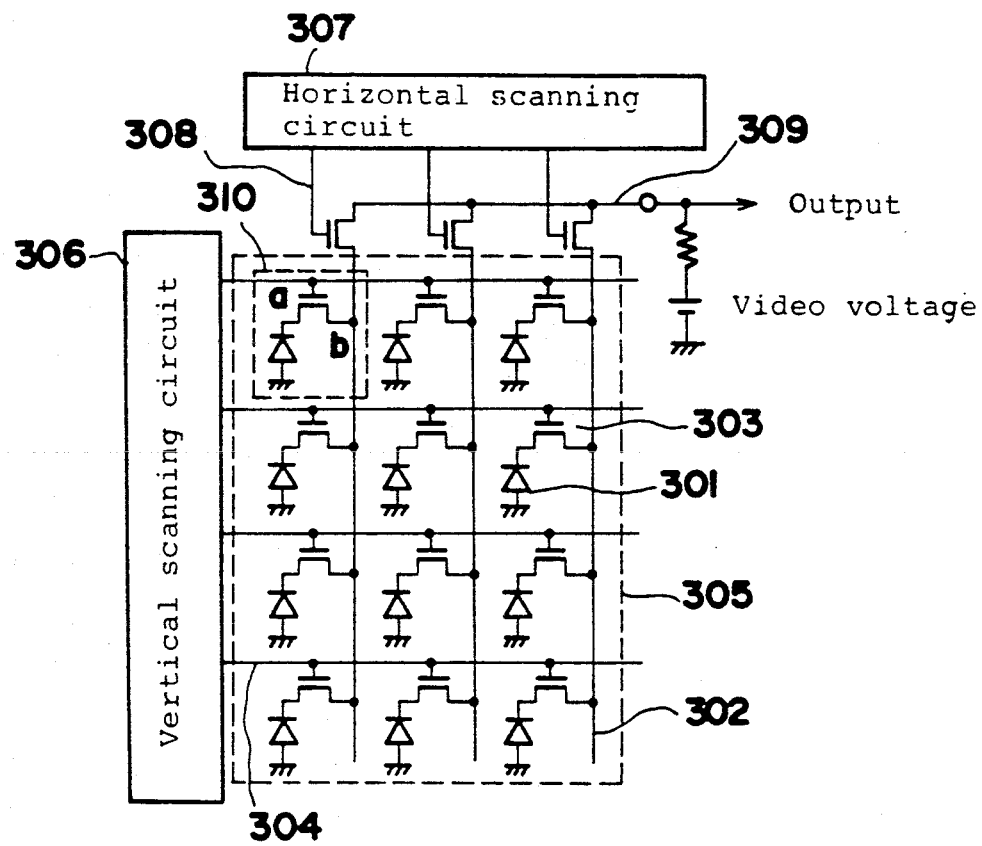
FIG.4 (Prior Art-2)
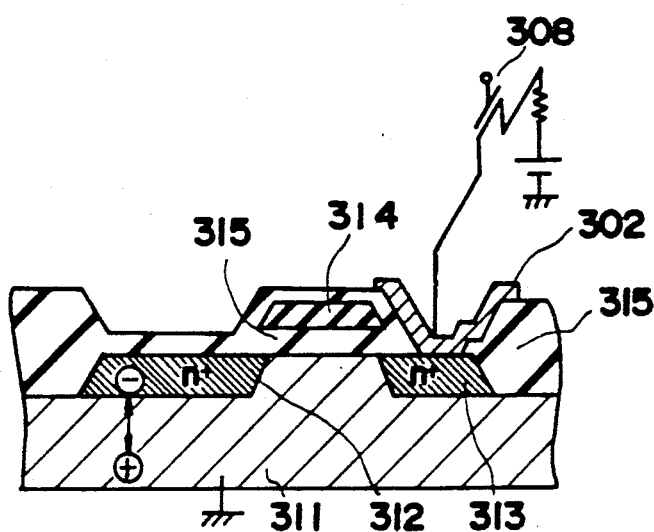

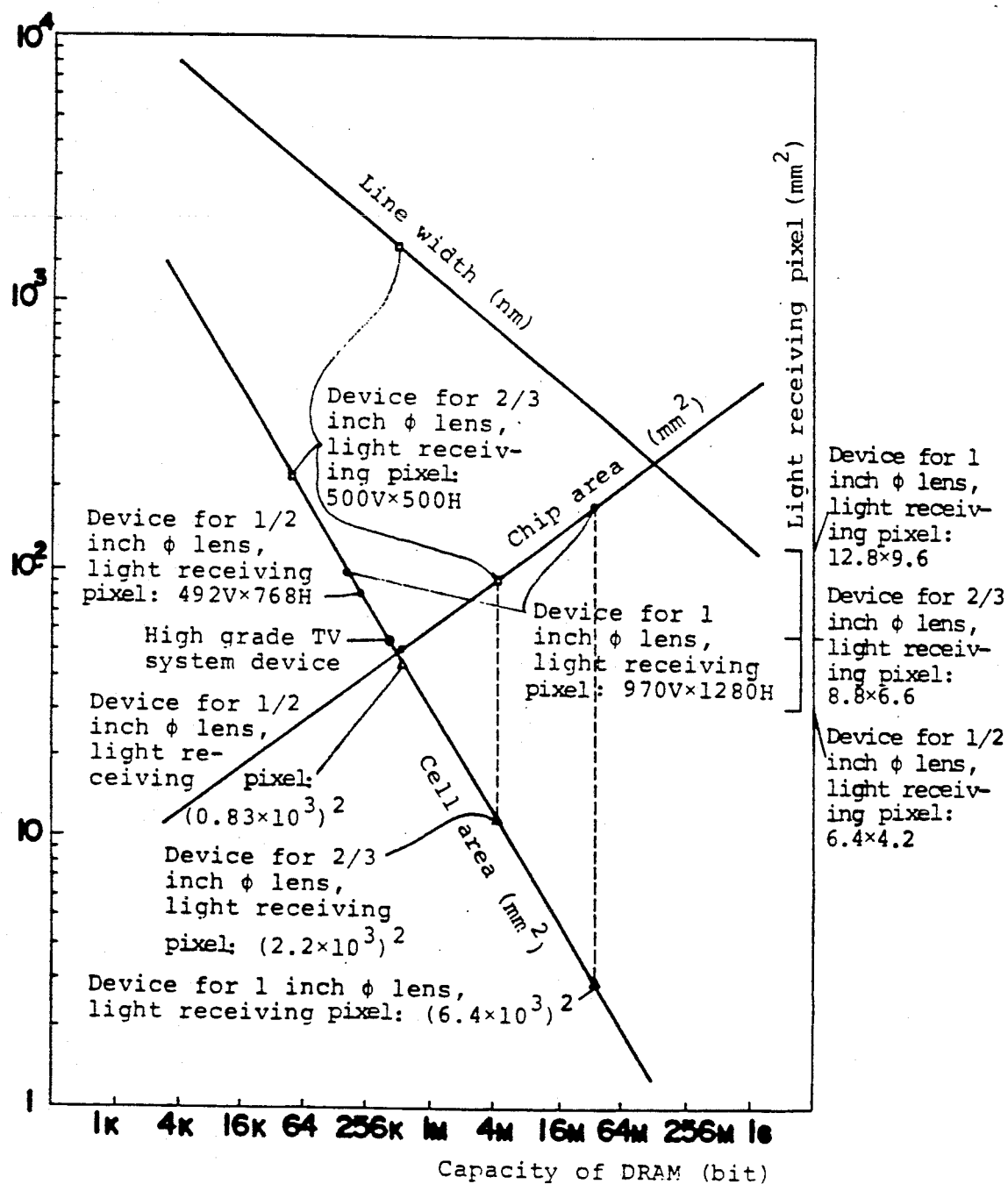
FIG.5 (Prior General)

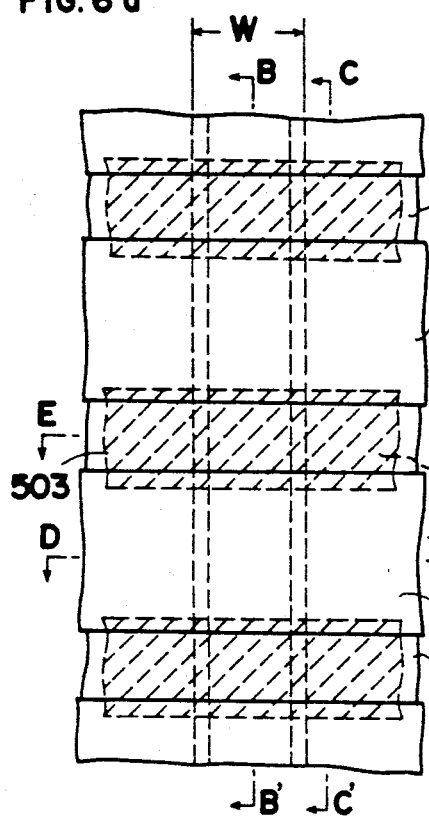
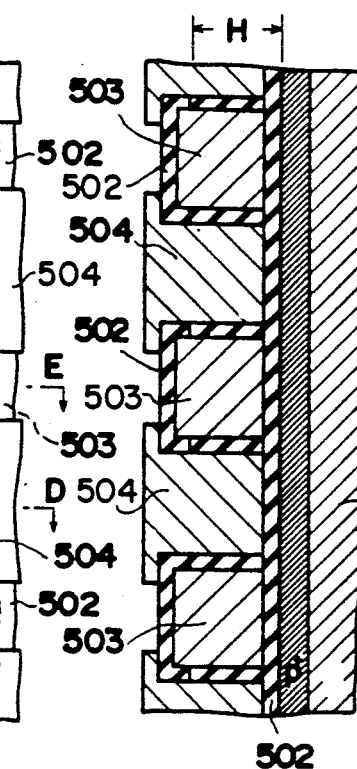
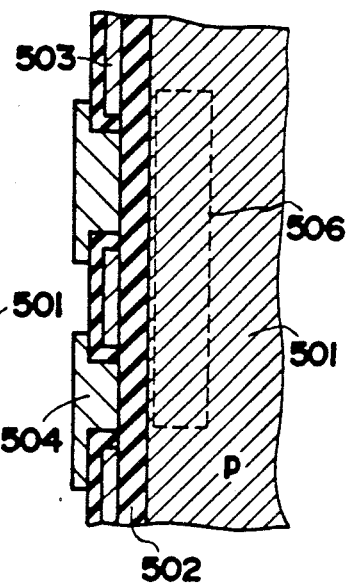
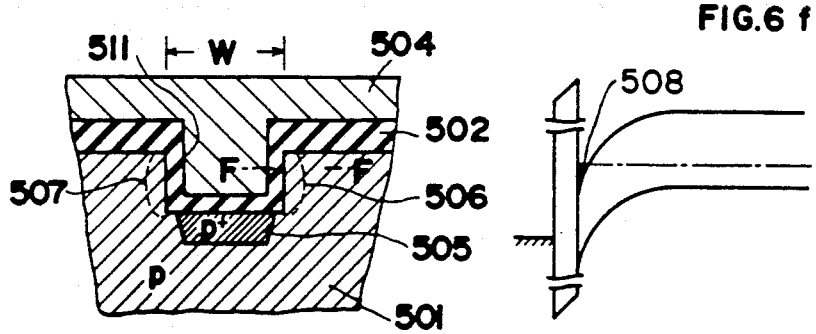
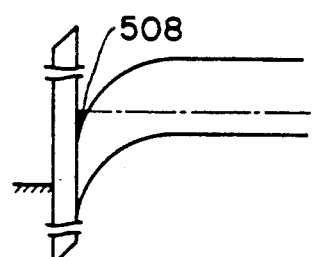
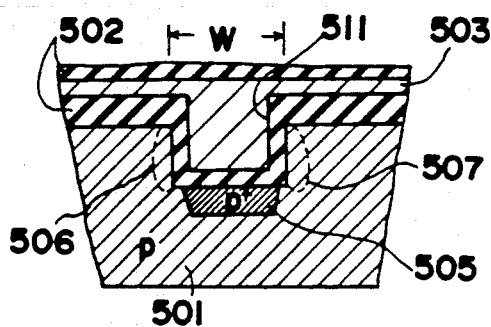

FIG. 6 g
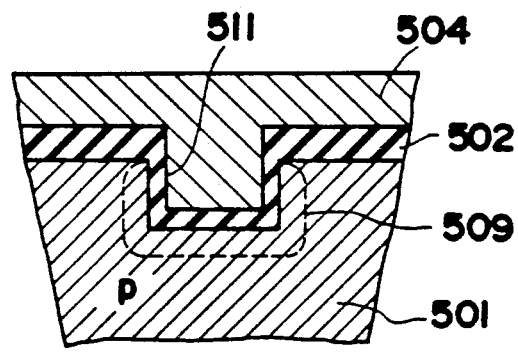
FIG. 6 h
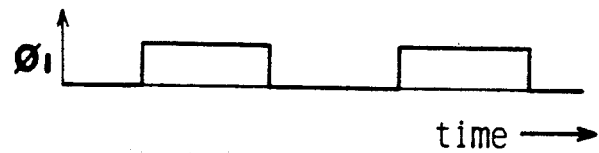
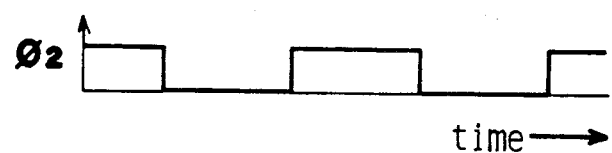

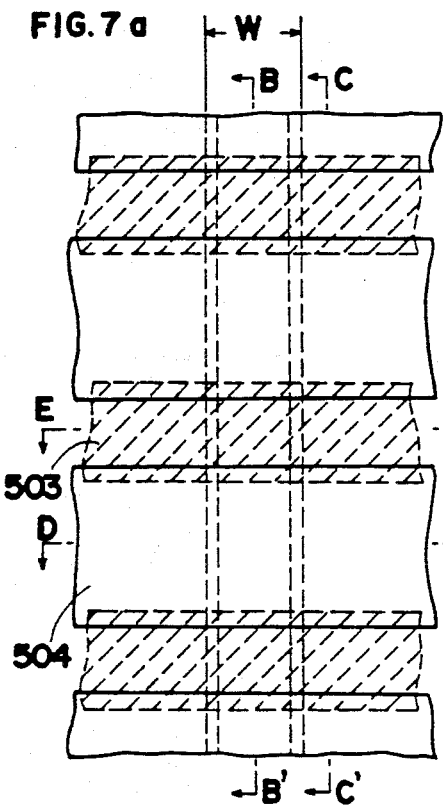
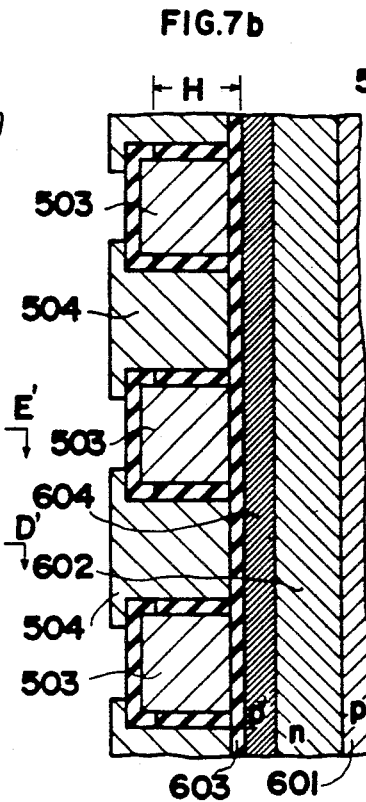
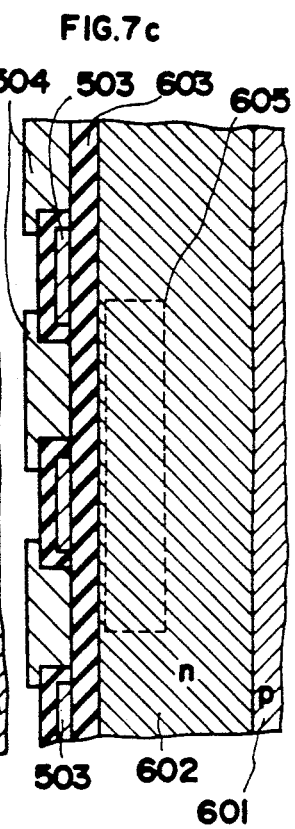
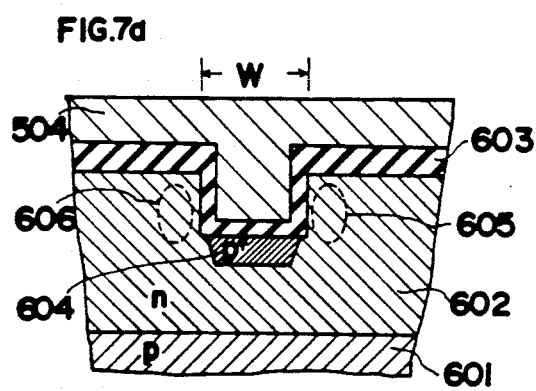
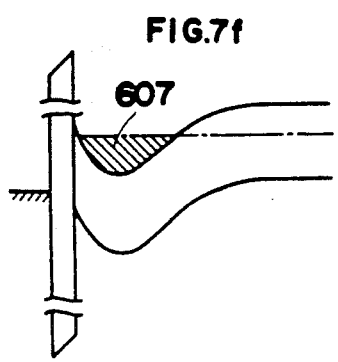
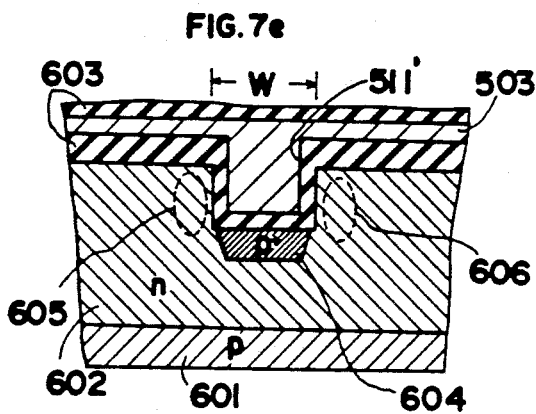

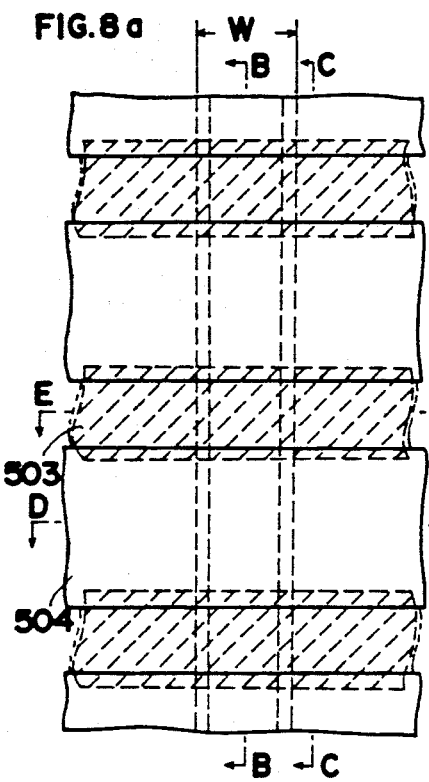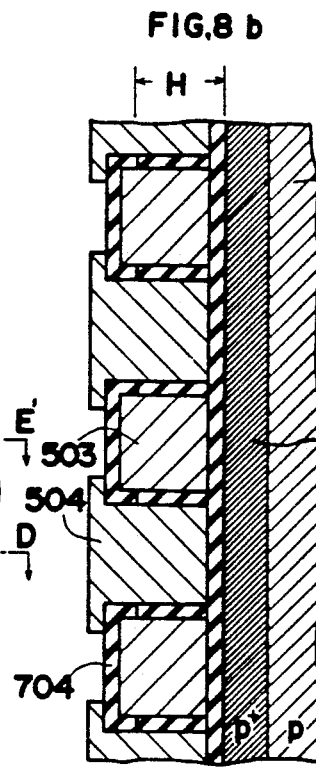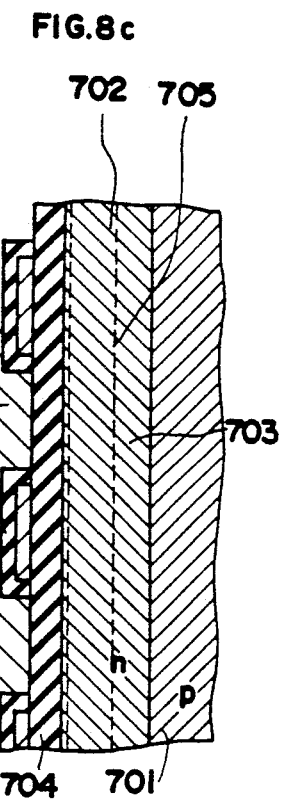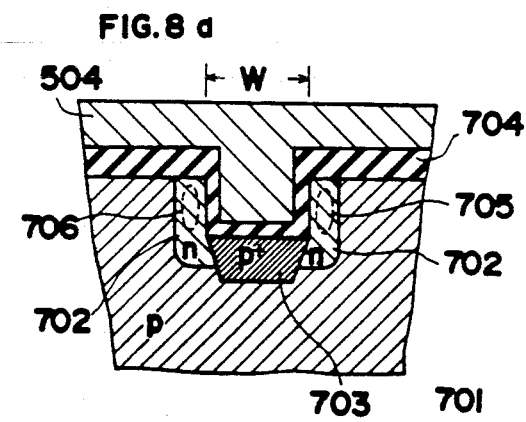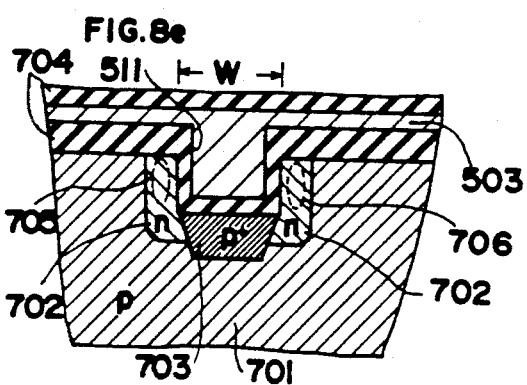

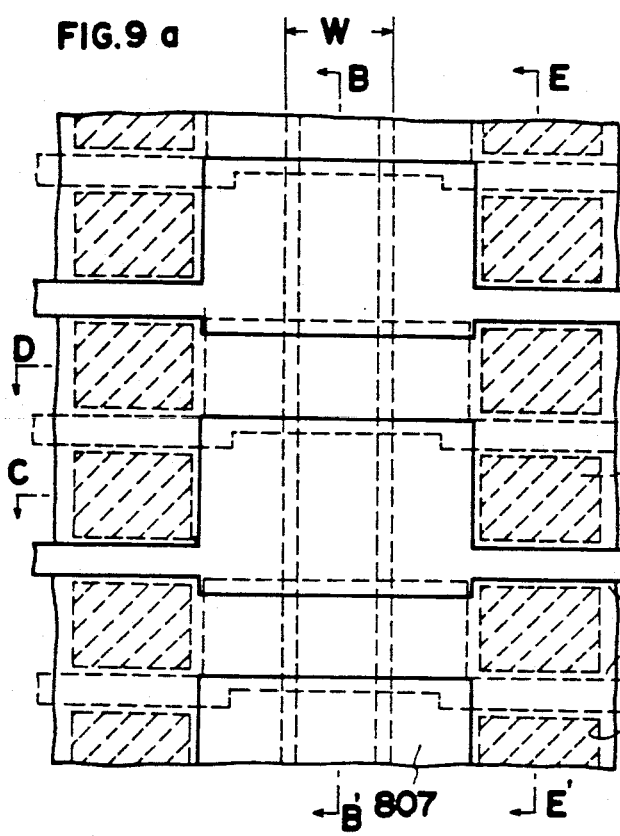
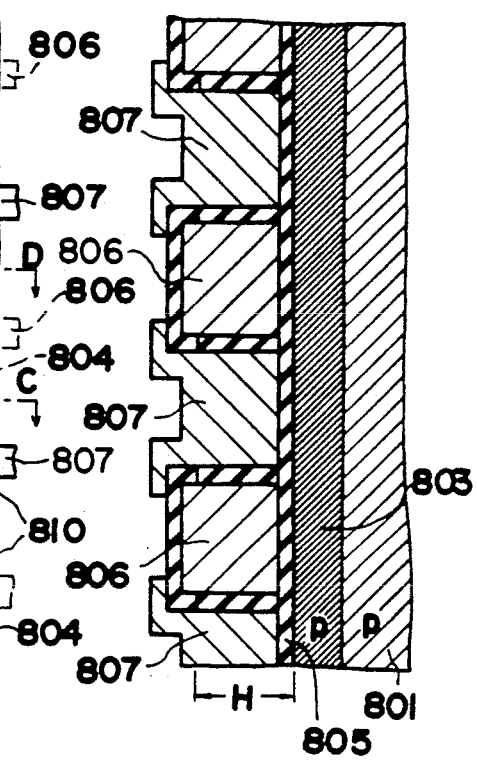
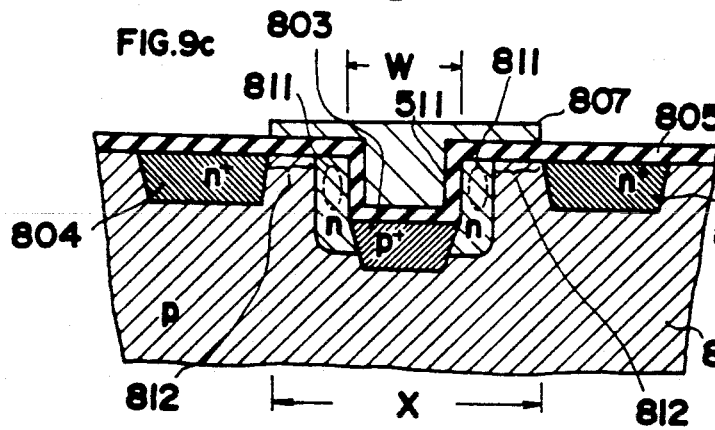
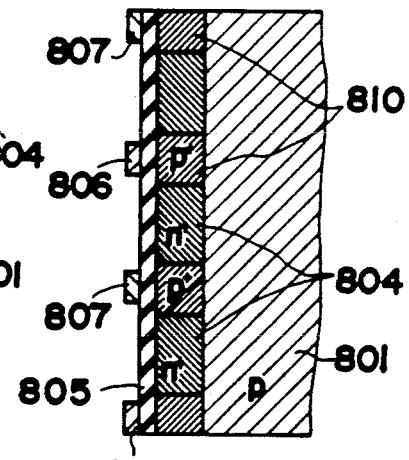
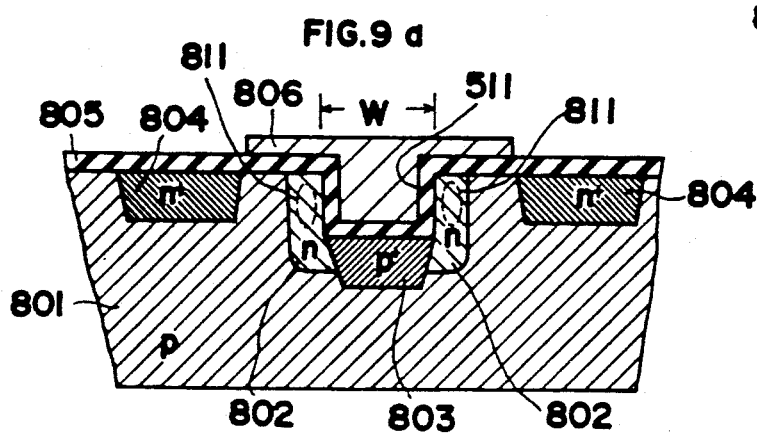

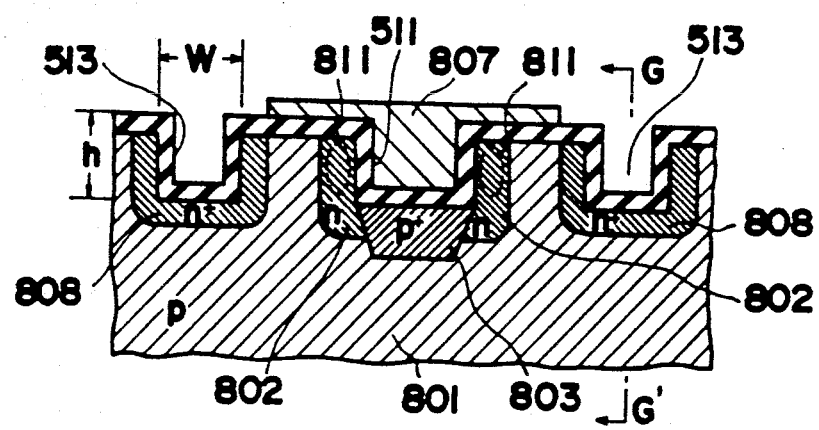
FIG. 9 f
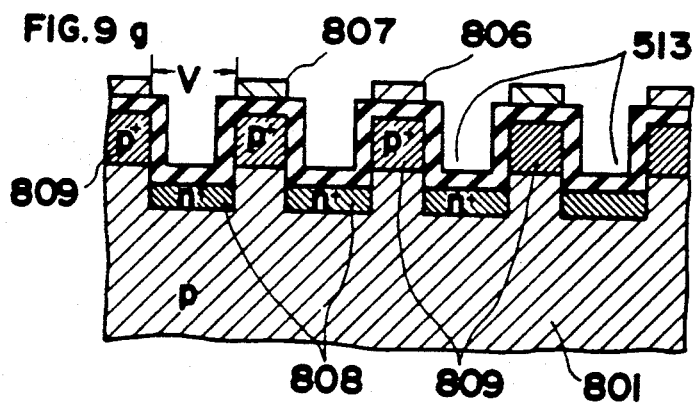
FIG. 9 g
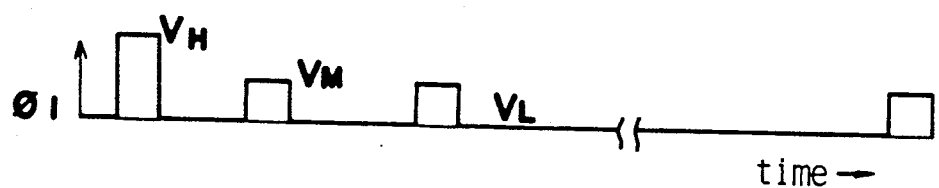
FIG. 9 h
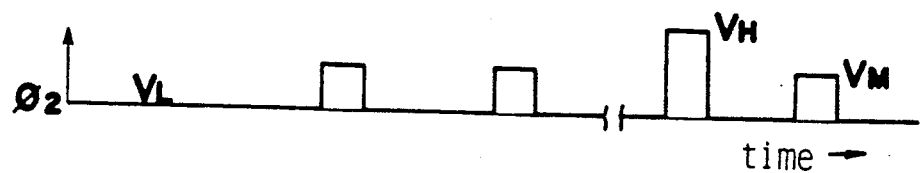

FIG.11(j-1)
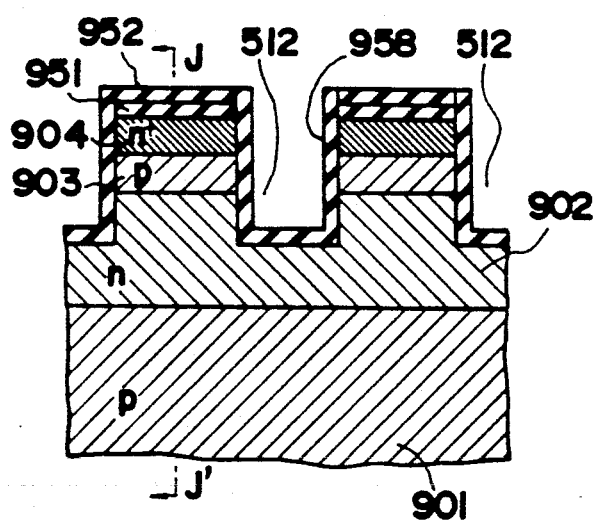
FIG.11(j-2)
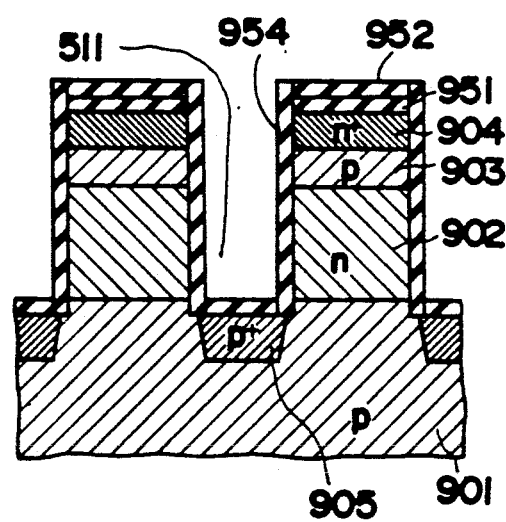

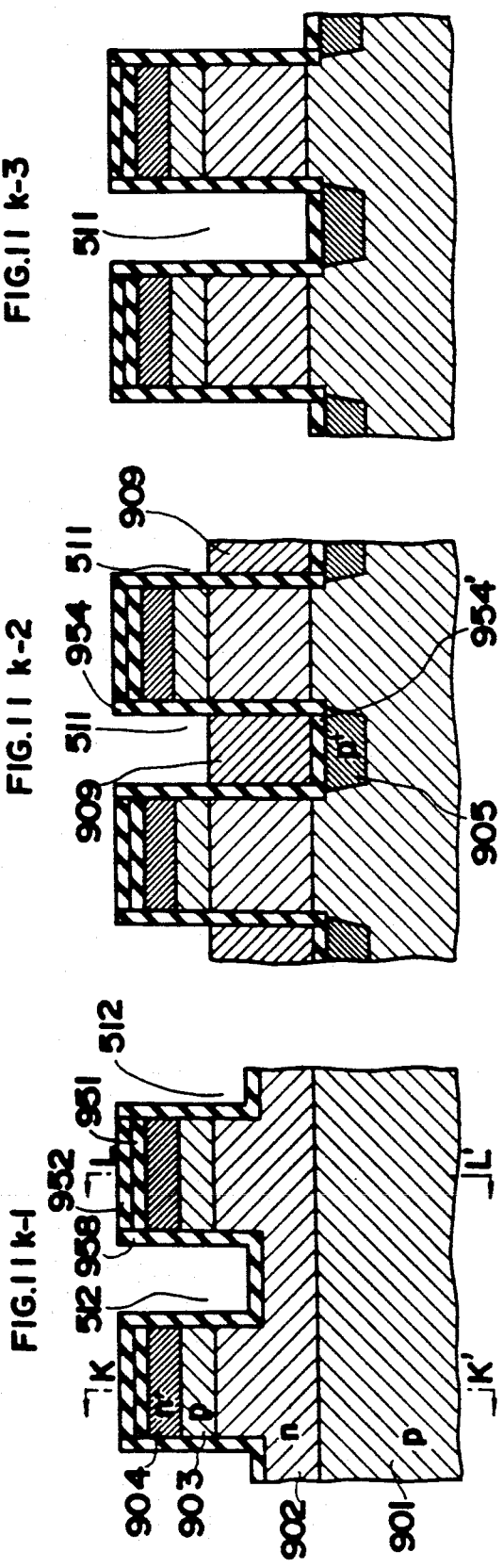
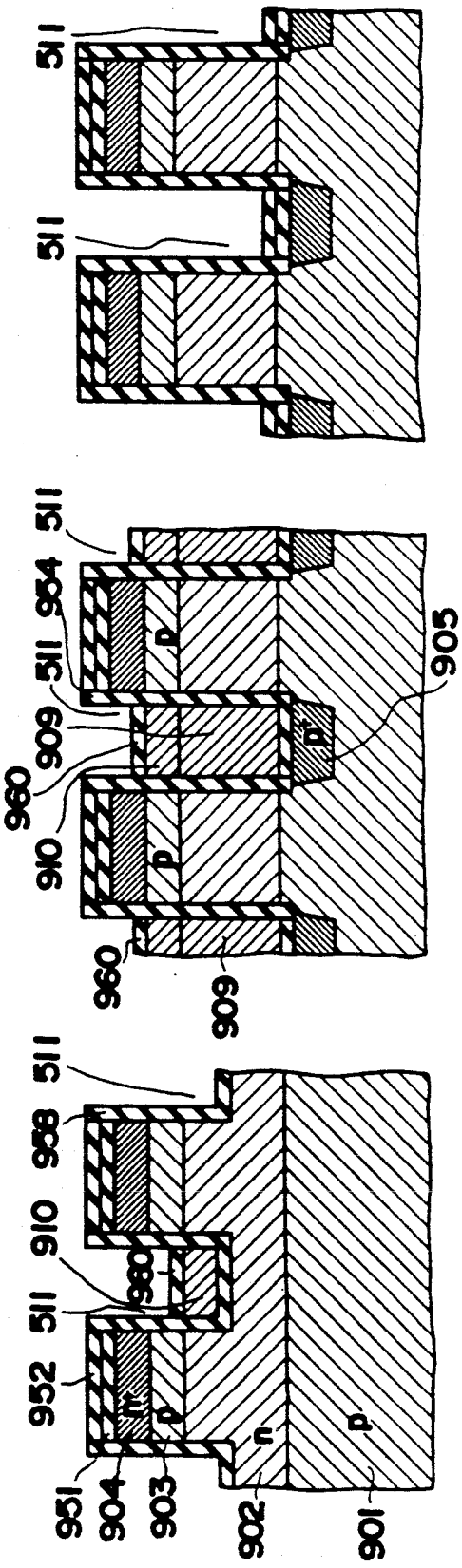

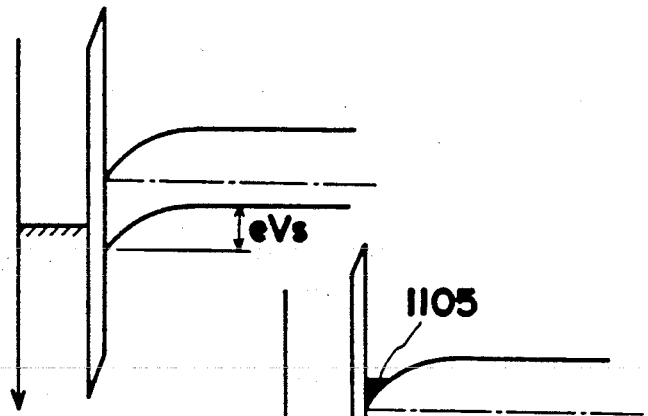
FIG.14 e
FIG.14 f
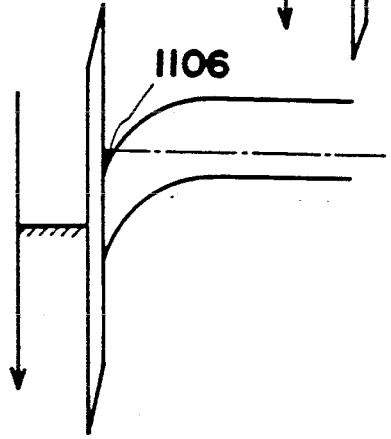
FIG.14 g
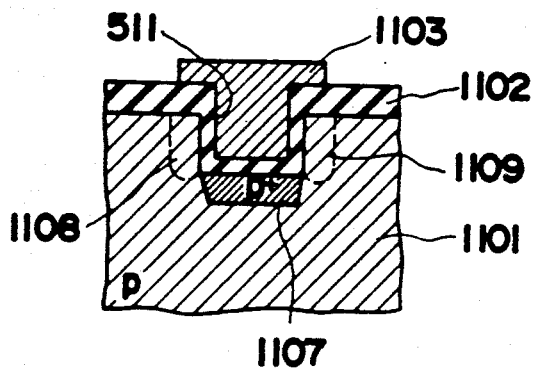
FIG.14 h

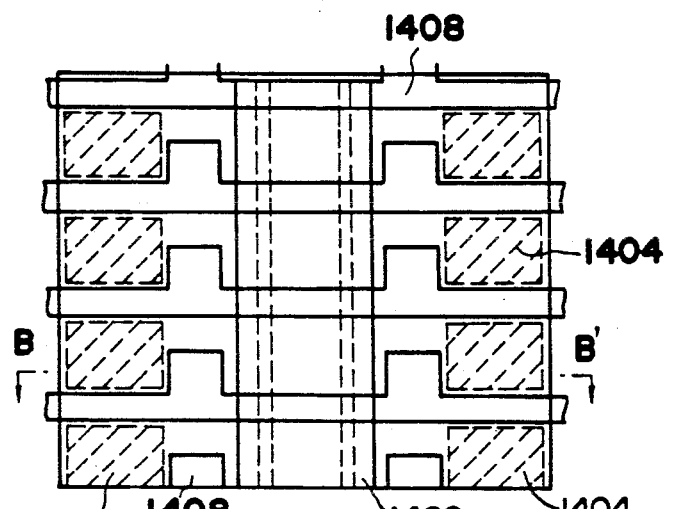
FIG.17 a
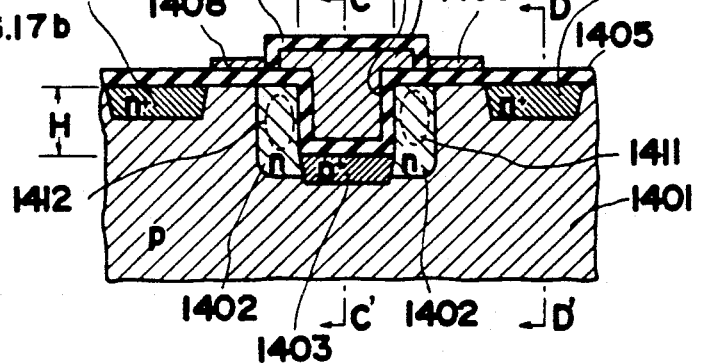
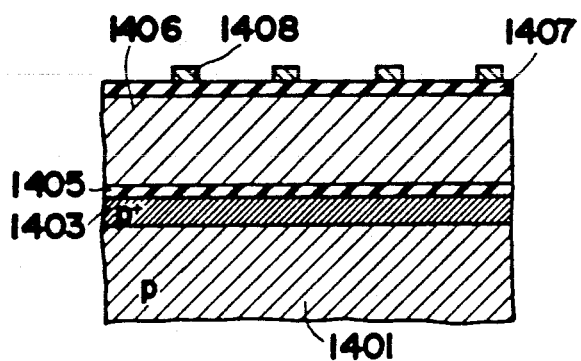
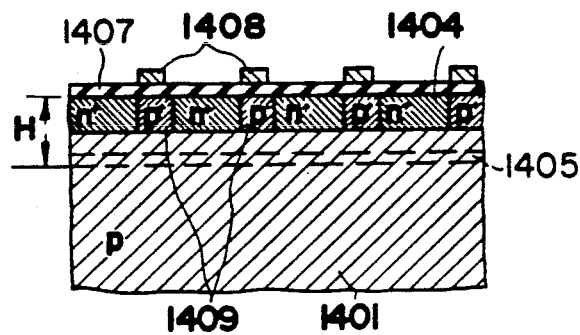

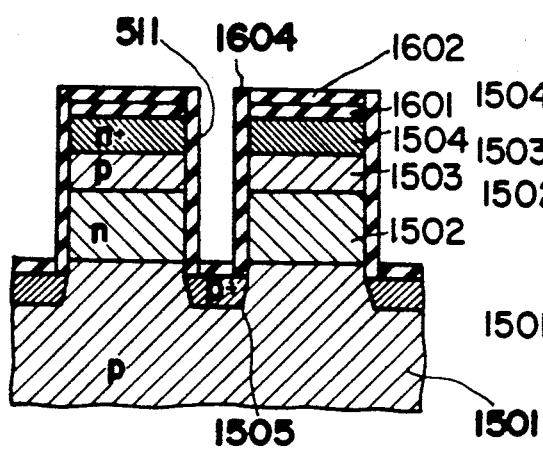
FIG.19 j-2
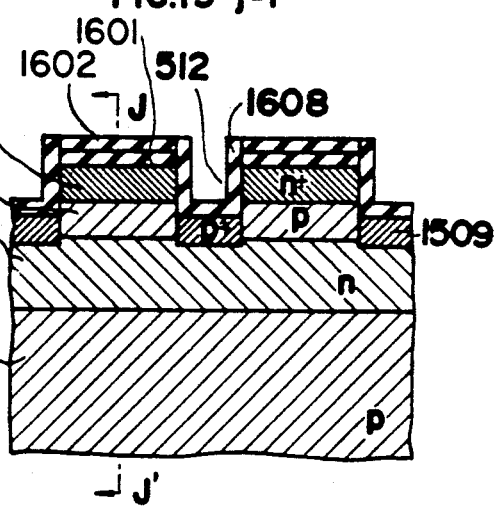
FIG.19 j-1
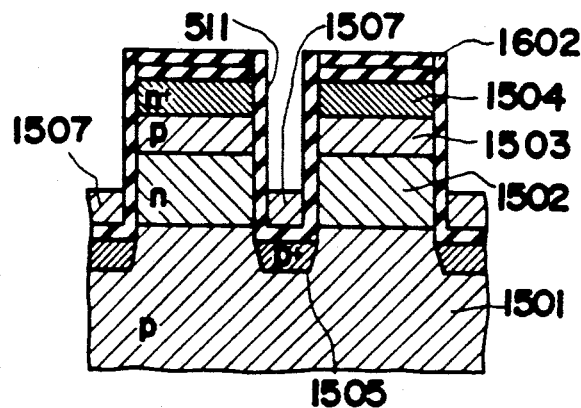
FIG.19 k
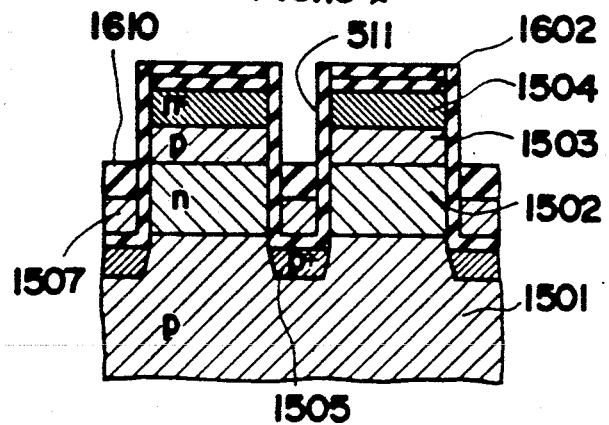
FIG.19 ℓ

CHARGE COUPLED DEVICE FOR A SOLID STATE IMAGE PICK-UP DEVICE

This is a continuation of application Ser. No. 07/128,119, filed on Nov. 30, 1987, which is now abandoned.

FIELD OF THE INVENTION AND RELATED ART STATEMENT

1. Field of the Invention

The present invention relates to a semiconductor device and method for making the same, and more particularly to a semiconductor device wherein charges are transferred.

2. Description of the Related Art

In semiconductor devices, such as imaging apparatus, there are two ways of moving charge. A first way is charge transferring, and a second way is charge transporting. In the first way, namely, the charge transferring, the charge is transferred by the signal charges themselves; and in the second way, namely charge transporting, the charge is transported by charges corresponding to signal charges.

Conventional representative semiconductor devices utilizing the charge transferring is CCD, namely charge coupled device, for instance disclosed in C.H. Sequin, M.F. Tompsett "Charge Transfer Device" published by Academic Press New York, N.Y. 1975. And among the semiconductor devices using the CCD, recently CCD type image pick-up devices have become very much popular. The CCD image pick-up device comprises a light sensitive part 103, which consists of photo electric conversion regions 101, and vertical CCD part 102, a horizontal CCD part 104, and an output circuit 105. Detailed sectional configuration of the light sensitive part 103 is shown in FIG. 2, wherein on the surface part of a p-type substrate 106, n+-regions 107 are formed, thereby forming p—n photo diodes in the photo electric conversion region 103, and n⁻-regions 108 of high resistivity and gate transfer electrodes 109 which together constitute the vertical CCD part 102.

On the other hand, as a conventional representative semiconductor device having signal transportation line, there is MOS type image pick-up device, for example as shown in P.K. Weimer, "Image Sensors for Solid State Cameras", Advances in Electronics and Electron Physics, vol. 37, P. 181-262, 1975. The MOS type imaging device is configurated as shown in FIG. 3, by comprising light sensitive parts 305 which consist of photo diodes 301, vertical signal transportation lines 302, vertical switching MOS transistors 303, and vertical gate lines 304, horizontal MOS switching transistors 308 and horizontal signal transportation line 309. Detailed sectional configuration of the MOS type imaging device of FIG. 3 is shown in FIG. 4. As shown in FIG. 4, an n+-region 312 formed on a surface of p-type substrate 311 constitute the photo diode 301, and an n+-drain region 313 contacts the vertical signal transportation line 302. Vertical gate lines 304 of FIG. 3 is formed as gate electrode 314 in FIG. 4 on an insulation layer 315.

The above-mentioned conventional imaging device, as shown in FIG. 1 through FIG. 4, could not easily fulfill all requirements of sensitivity improvement, resolution and noise characteristic at the same time.

FIG. 5 shows a relation of the memory capacity of a MOS dynamic RAM versus line width, chip area and cell area and further correspondence with CCD type imaging device. As is obvious from FIG. 5, pixel numbers of the CCD drastically increase by application of a fine patterning technology of DRAM. This is obtained by defining the area of one pixel as the area of one cell at that time when such a DRAM that has a chip area equal to a chip area of a CCD imaging device (consisting of light receiving area of optical system used and area of related circuit part—substantially constant). For instance, when the area of one cell of the 4 Mb DRAM is considered to be the equal to area of a pixel, the number of pixels of a CCD type imaging device of ⅔ inch size can be increased up to 2000×2000=4×10⁶. Hereupon, in the CCD type imaging device of FIG. 1 and FIG. 2, its sensitivity depends on the aspect ratio of the CCD type imaging device, which is defined as the total area of photoelectric conversion reach on 101 to the area of the light receiving part 103; and on the other hand its dynamic range depends on channel width, which determines the maximum charge transfer amount of the vertical CCD 102 (namely, the width of the high resistivity n⁻-region 108). Furthermore, the resolution of the device depends on the number of pixels, and an increase in the number of pixels inevitably increases the total area of the channel stopper region 110 (FIG. 2) or the like pixel isolation region, and hence decreases sensitivity and dynamic range. Therefore in the conventional CCD type imaging device, the optimum value of sensitivity, resolution and dynamic range are determined when the area of the light receiving part 103 is given. Accordingly, in the prior part device, increasing the pixel number from the conventional 500×500 to 2000×2000 (which is usable in an imaging device for high grade TV system) in a CCD type imaging device of ⅔ inch size has been very difficult.

On the other hand, effective noise charge $\overline{Q}_N^2$ in a MOS type imaging device such as of FIG. 3 and FIG. 4 is given by a formula of $$Q_N^2 = \frac{2}{\pi} \cdot kTC_V \arctan(\omega RC_V), \quad (1)$$

wherein R is resistance of a vertical switching MOS transistor in ON state, $C_V$ is capacity of a vertical signal transportation line 302, $\omega$ is angular frequency of signal to be transferred and k is Boltzmann constant. As is understood from the formula 1, when the configuration becomes minute, even though the line capacitance $C_V$ is decreased, reducing noise becomes very difficult, since parasitic capacitances which are parallel to the capacitances $C_V$ increase and also the resistances increase.

In addition, metal-semiconductor contacts between the vertical signal transportation line 302 and the n+-drain region 313 do not generally become ideal ohmic contact, but the forward characteristic is liable to become more deteriorated than the case of a p—n junction. This problem becomes more prominent as the configuration becomes smaller, and hence becomes a source of noise.

Furthermore, actual metal-semiconductor contact in the MOS type imaging device changes its band structure depending of surface level of the semiconductor, and hence the stability of the metal semiconductor contact cannot be satisfactorily controlled by only raising the concentration of the n+-type region 313. Still furthermore, aluminum conductors which are ordinarily used as the vertical signal transportation line 302 are liable to react with silicon substrate 311 during thermal processing, and produce pits which become a cause of defects. And further, the Al conductor is liable to make a low temperature interface reaction which causes a large amount of mutual diffusion between Si and Al, even the operational temperature of the imaging device, thereby becoming a source of noise.

Summarizing the above, prior arts have the following subject to be solved: in the CCD type imaging device of FIG. 1 and FIG. 2, it is necessary to realize a transfer region having a small area and a large dynamic range; and in the MOS type imaging device of FIG. 3 and FIG. 4, it is necessary to realize a transportation region which is not influenced by interface phenomena and not influenced by the ohmic resistivity.

OBJECT AND SUMMARY OF THE INVENTION

An object of the present invention is to provide a semiconductor imaging device capable of high resolution and high sensitivity and large dynamic range or small noise.

A semiconductor imaging device in accordance with the present invention comprises:

a semiconductor layer of high resistivity having an oblong groove in one direction;

an insulation film formed on an inside wall of the groove; and at least one gate electrode formed on the insulation film crosswise or parallelly to the groove, to form depletion region or regions as charge conveying regions in the semiconductor layer, at vicinity of the longitudinal groove.

BRIEF DESCRIPTION OF THE DRAWINGS

FIG. 1 is the block diagram of the conventional CCD imaging device.

FIG. 2 is the enlarged cross-sectional view of the essential part of the CCD imaging device of FIG. 1.

FIG. 3 is the circuit diagram of the conventional MOS type imaging device.

FIG. 4 is the enlarged cross-sectional view of the MOS type imaging device of FIG. 3.

FIG. 5 is the graph showing the relation between various characteristic data of DRAM and imaging device and memory capacity.

FIG. 6a is a plan view of a first example of semiconductor device in accordance with the present invention.

FIG. 6b is a cross-sectional view taken by a plane shown by sectional line B—B' on FIG. 6a.

FIG. 6c is a cross-sectional view taken by a plane shown by sectional line C—C' on FIG. 6a.

FIG. 6d is a cross-sectional view taken by a plane shown by sectional line D—D' on FIG. 6a.

FIG. 6e is a cross-sectional view taken by a plane shown by sectional line E—E' on FIG. 6e.

FIG. 6f is an energy band diagram at principal operation state along F—F' section.

FIG. 6g is a sectional view of a modified example taken at D—D' section of FIG. 6a.

FIG. 6h is a waveform diagram showing operation pulse.

FIG. 7a is a plan view of a second example of semiconductor device in accordance with the present invention.

FIG. 7b is a cross-sectional view taken by a plane shown by sectional line B—B' on FIG. 7a.

FIG. 7c is a cross-sectional view taken by a plane shown by sectional line C—C' on FIG. 7a.

FIG. 7d is a cross-sectional view taken by a plane shown by sectional line D—D' on FIG. 7a.

FIG. 7e is a cross-sectional view taken by a plane shown by sectional line E—E' on FIG. 7e.

FIG. 7f is an energy band diagram at principal operation state along F—F' section.

FIG. 8a is a plan view of a third example of semiconductor device in accordance with the present invention.

FIG. 8b is a cross-sectional view taken by a plane shown by sectional line B—B' on FIG. 8a.

FIG. 8c is a cross-sectional view taken by a plane shown by sectional line C—C' on FIG. 8a.

FIG. 8d is a cross-sectional view taken by a plane shown by sectional line D—D' on FIG. 8a.

FIG. 8e is a cross-sectional view taken by a plane shown by sectional line E—E' on FIG. 8e.

FIG. 9a is a plan view of a fourth example of semiconductor device in accordance with the present invention.

FIG. 9b is a cross-sectional view taken by a plane shown by sectional line B—B' on FIG. 9a.

FIG. 9c is a cross-sectional view taken by a plane shown by sectional line C—C' on FIG. 9a.

FIG. 9d is a cross-sectional view taken by a plane shown by sectional line D—D' on FIG. 9a.

FIG. 9e is a cross-sectional view taken by a plane shown by sectional line E—E' on FIG. 9e.

FIG. 9f is a cross-sectional view of a partly modified example from the example of FIG. 9a through FIG. 9e, but has a sectional view shown in FIG. 9f taken at a cross-section C—C' of FIG. 9a.

FIG. 9g is a sectional view taken at a cross-section G—G' on FIG. 9f.

FIG. 9h is a waveform chart showing driving pulses of the example of FIG. 9.

FIG. 10a is a plan view of the embodiment device.

FIG. 10b is a cross-sectional view taken by a plane shown by sectional line B—B' on FIG. 10a.

FIG. 10c is a cross-sectional view taken by a plane shown by sectional line C—C' on FIG. 10a.

FIG. 10d is a cross-sectional view taken by a plane shown by a sectional line D—D' on FIG. 10a.

FIG. 10e is a cross-sectional view taken by a plane shown by sectional line E—E' on FIG. 10a.

FIG. 10f and FIG. 10g show knocked down perspective view of the semiconductor device of this embodiment, wherein FIG. 10f shows lower part comprising the substrate and the overriding semiconductor regions, and FIG. 10g shows the overriding part comprising the polysilicon gate electrodes shown with the further overriding insulation films 906.

FIG. 11a, FIG. 11b, FIG. 11c, FIG. 11d, FIG. 11e, FIG. 11f, FIG. 11g, FIG. 11h, FIG. 11i, FIG. 11j, FIG. 11j-2, FIG. 11k-1, FIG. 11k-2, FIG. 11k-3, FIG. 11l-1, FIG. 11l-2, FIG. 11l-3, FIG. 11m-1, FIG. 11m-2, FIG. 11m-3, FIG. 11n-1, FIG. 11n-2 and FIG. 11n-3 show manufacturing process of the semiconductor device of FIG. 10a through FIG. 10e.

FIG. 14a is a plan view of the device.

FIG. 14b is a cross-sectional view taken at B—B' sectional plane shown in FIG. 14a.

FIG. 14c is a cross-sectional view taken at C—C' sectional plane shown in FIG. 14a.

FIG. 14d is a cross-sectional view taken at D—D' sectional plane shown in FIG. 14d.

FIG. 14e, FIG. 14f and FIG. 14g are energy band diagrams on C—C' cross-section of FIG. 14b.

FIG. 15a through FIG. 15g shows a seventh embodiment of the semiconductor device in accordance with a present invention wherein FIG. 15a is a plan view, FIG. 15b is a cross-sectional view taken at a sectional plane B—B' of FIG. 15a, FIG. 15c is a cross-sectional view taken at a sectional plane C—C' of FIG. 15a, FIG. 15d is a cross-sectional view taken at a sectional plane D—D' of FIG. 15a, FIG. 15e, FIG. 15f and FIG. 15g are energy band diagram at the sectional plane C—C' of FIG. 15b.

FIG. 16a through d show an eighth embodiment in accordance with the present invention; wherein FIG. 16a is a plan view, FIG. 16b is a cross-sectional view taken at a sectional plane B—B' of FIG. 16a, FIG. 16c is a cross-sectional view taken at a sectional plane C—C' of FIG. 16a, FIG. 16d is a cross-sectional view taken at a sectional plane D—D' of FIG. 16a.

FIG. 17a through FIG. 17f show a ninth embodiment of semiconductor imaging device in accordance with the present invention; wherein FIG. 17a is a plan view, FIG. 17b is a cross-sectional view taken at a sectional plane B—B' of FIG. 17a, FIG. 17c is a cross-sectional view taken at a sectional plane C—C' of FIG. 17a, FIG. 17d is a cross-sectional view taken at a sectional plane D—D' of FIG. 17a.

FIG. 17e and FIG. 17f show a modified example of FIG. 17, wherein:

FIG. 17e is a cross-sectional view taken at cross-section B—B' on FIG. 17a and

FIG. 17f is a cross-sectional view of the modified embodiment taken at sectional plane F—F' on FIG. 17e.

FIG. 18a through FIG. 18g show a tenth embodiment of the semiconductor device in accordance with the present invention; wherein FIG. 18a is a plan view, FIG. 18b is a cross-sectional view taken at a sectional plane B—B' of FIG. 18a, FIG. 18c is a cross-sectional view taken at a sectional plane C—C' of FIG. 18a, FIG. 18d is a cross-sectional view taken at a sectional plane D—D' of FIG. 18a, FIG. 18e is a cross-sectional view taken at a sectional plane E—E' of FIG. 18a.

FIG. 18f and FIG. 18g are perspective views showing knock down configuration of the silicon single crystal part of the device and silicon polycrystalline part of the same, respectively.

FIG. 19a, FIG. 19b, FIG. 19c, FIG. 19d, FIG. 19e, FIG. 19f, FIG. 19g-1, FIG. 19g-2, FIG. 19h, FIG. 19i, FIG. 19j-1, FIG. 19j-2, FIG. 19k, FIG. 19l, FIG. 19m-1, FIG. 19m-2, FIG. 19n-1 and FIG. 19n-2 show manufacturing steps of the semiconductor device shown in FIG. 18a through FIG. 18f.

DESCRIPTION OF THE PREFERRED EMBODIMENTS

Figure 9I:
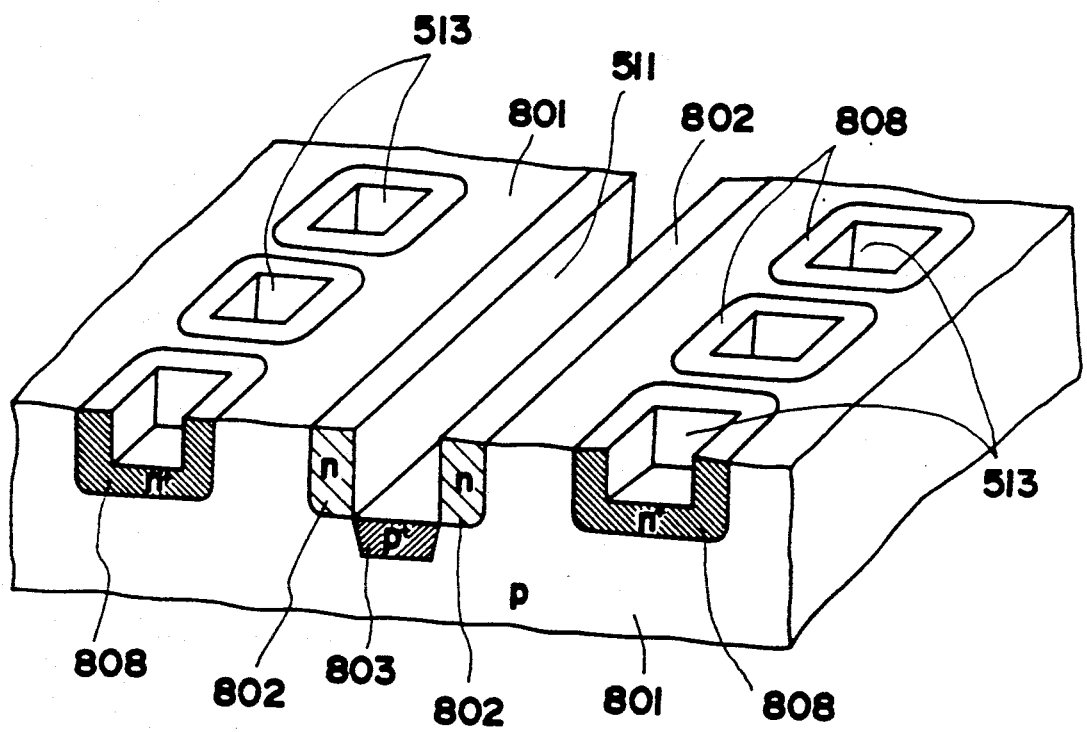
FIG. 9i is a perspective view of the device shown by FIG. 9f and FIG. 9g.

FIG. 6a through FIG. 6f show a first embodiment of a CCD type imaging device. FIG. 6a is a plan view of the device. FIG. 6b is a cross-sectional view taken by a plane shown by sectional line B—B' on FIG. 6a. FIG. 6c is a cross-sectional view taken by a plane shown by sectional line C—C' on FIG. 6a. FIG. 6d is a cross-sectional view taken by a plane shown by sectional line D—D' on FIG. 6a. FIG. 6e is a cross-sectional view taken by a plane shown by sectional line E—E' on FIG. 6e. As shown in FIG. 6a through 6e, a substrate 501 of high resistivity p-type semiconductor has at least one oblong trench or groove 511 of width W and depth H. Crossing over the groove 511 and partly filling therein, at least one first polysilicon region 503 is provided, being isolated by insulation film 502 therearound, and at least one second polysilicon region 504 also isolated by insulation film 502 therearound so that the first polysilicon region 503 and the second polysilicon region 504 are insulated from each other and from the substrate 501 by the insulation film 502, thereby to form gate electrodes. Further, p+-type channel stopper region 505 is formed along and under the bottom of the oblong groove 511. Then, on both outside faces of the insulation film 502, on both sides of the groove 511, a pair of charge transfer regions 506 and 507 are formed in the principal operation state; and potential levels of these charge transfer regions 506, 507 correspond to the potential level of the surface channel part 508 shown in FIG. 6f.

FIG. 6g shows a modified example wherein the p+-type channel stopper like 505 of FIG. 6d and FIG. 6e is not produced; and in this configuration a charge transfer region 509 is formed in the principal operation state on both side faces of the groove 511 and under the bottom of the groove 511 in continuity.

Operations of the example of FIG. 6a through FIG. 6f and also of FIG. 6g are elucidated with reference to the pulse waveform diagram of FIG. 6h. A pair opposite phase pulses $\phi 1$ and $\phi 2$ are impressed on the first polysilicon region 503 and the second polysilicon region 504 as the gate electrodes, or vice versa. Then, a charge transfer in the lengthwise direction of the oblong groove 511 in the charge transfer regions 506 and 507 of FIG. 6d and FIG. 6e or 509 of FIG. 6g is carried out.

In the example of FIG. 6d and FIG. 6e, where channel stopper 505 is formed thereby to divide the two charge transfer regions 506 and 507, these two charge transfer regions 506 and 507 can be made as separate channel transfer means. On the other hand, in the example of FIG. 6g where such p+-type channel stopper is not provided, a single U-shaped section charge transfer region 509 only is formed thereby forming only one charge transfer region.

As shown in FIG. 6a through FIG. 6h, by forming an oblong groove in one direction on the surface of the high resistivity semiconductor substrate layer, and further providing thereon plural transfer gate electrodes with insulation film in-between, charges formed on the side walls of the grooves made by CCD are transferred, and the amount of maximum charge transfer depends on depth H of the groove. On the other hand, the width W of the groove 511 can be about 0.8 μm by utilizing a manufacturing technology corresponding to a 4 Mb DRAM, and the area necessary for forming the vertical CCD part is only very small.

In the above-mentioned example, as a modification, the p+-type channel stopper can be replaced by a thick insulation film formed formed at the place where the p+-type channel stopper 505 was formed.

FIG. 7a through FIG. 7f show a second embodiment of the CCD type imaging device. FIG. 7b is a cross-sectional view taken by a plane shown by sectional line B—B' on FIG. 7a. FIG. 7c is a cross-sectional view taken by a plane shown by sectional line C—C' on FIG. 7a. FIG. 7d is a cross-sectional view taken by a plane shown by sectional line D—D' on FIG. 7a. FIG. 7e is a cross-sectional view taken by a plane shown by sectional line E—E' on FIG. 7e. As shown in FIG. 7a through 7e, a high resistivity n-type semiconductor layer 602 formed on a p-type substrate 601 has at least one oblong groove 511 of width W and depth H. Crossing over the groove 511 and partly filling therein, at least one first polysilicon region 503 is provided, being isolated by insulation film 603 therearound, and at least one second polysilicon region 504, also isolated by insulation film 603 therearound, so that the first polysilicon region 503 and the second polysilicon region 504 are insulated from each other and from the n-type semiconductor layer 602 by the insulation film 603, thereby to form gate electrodes. Further, p+-type channel stopper region 604 is formed along and under the bottom of the oblong groove 511. Then, on both outsides of the side faces of the insulation film 502, near but slightly apart from both sides of the groove 511, a pair of buried charge transfer regions 605 and 606 are formed in the principal operation state; and potential levels of these charge transfer regions 605, 606 correspond to the potential level of the buried channel part 607 shown in FIG. 7f.

Operation of the second embodiment is the same as that of the first embodiment.

By making the high resistance semiconductor layer 602 in n-type region, the buried channels 605 and 606 are produced, and the influence of crystal imperfections at the surface of the groove 511 can be evaded, and therefore, the efficiency of the CCD transfer is improved and noise is reduced.

FIG. 8a through FIG. 8f show a third embodiment of the CCD type imaging device. FIG. 8a is a plan view of the device. FIG. 8b is a cross-sectional view taken by a plane shown by sectional line B—B' on FIG. 8a. FIG. 8c is a cross-sectional view taken by a plane shown by sectional line C—C' on FIG. 8a. FIG. 8d is a cross-sectional view taken by a plane shown by sectional line D—D' on FIG. 8a. FIG. 8e is a cross-sectional view taken by a plane shown by sectional line E—E' on FIG. 8e. As shown in FIG. 8a through 8e, in a p-type semiconductor substrate 701 at least a n-type high resistivity semiconductor region 702 is formed in an oblong shape and therein one oblong groove 511 of width W and depth H is made. Crossing over the groove and partly filling therein at least one first polysilicon region 503 is provided, being isolated by insulation film 704 therearound, and at least one second polysilicon region 504, also isolated by insulation film 704 therearound, so that the first polysilicon region 503 and the second polysilicon region 504 are insulated from each other and from the substrate by the insulation film 704, thereby to form gate electrodes. Further, p+-type channel stopper region 703 is formed along and under the bottom of the oblong groove 511. Then, in the n-type high resistivity regions 702, 702 on both outside faces of the insulation film 704 on both sides of the groove 511, a pair of buried charge transfer regions 705 and 706 are formed in the principal operation state.

Operation of the third embodiment is the same as that of the first embodiment.

The feature of the third embodiment is the configuration of the n-type high resistivity regions 702, 702; and such configuration is advantageous in some type of imaging device and in some type of manufacturing process.

FIG. 9a through FIG. 9f show a fourth embodiment of the CCD type imaging device. Therein, FIG. 9a is a plan view of the device. FIG. 9b is a cross-sectional view taken by a plane shown by sectional line B—B' on FIG. 9a. FIG. 9c is a cross-sectional view taken by a plane shown by sectional line C—C' on FIG. 9a. FIG. 9d is a cross-sectional view taken by a plane shown by sectional line D—D' on FIG. 9a. FIG. 9e is a cross-sectional view taken by a plane shown by sectional line E—E' on FIG. 9e. As shown in FIG. 9a through 9e, in a p-type semiconductor substrate 801 at least one n-type high resistivity semi-conductor region 802 is formed in oblong shape and therein at least one oblong groove 511 of width W and depth H is made. Crossing over the groove and partly filling therein, at least one first polysilicon region 806 is provided, being isolated by insulation film 805 therearound, and at least one second polysilicon region 807, also isolated by insulation film 805 therearound, so that the first polysilicon region 806 and the second polysilicon region 807 are insulated from each other and from the substrate by the insulation film 805, thereby to form gate electrodes. Further, p+-type channel stopper region 803 is formed along and under the bottom of the oblong groove 511. Then, on both outside faces of the insulation film 805 on both sides of the groove 511, a pair of buried charge transfer regions 811 and 811 are formed in the principal operation state; and on the other hand, n+-type regions 804, 804, . . . to form p-n junctions as photoelectric conversion regions are formed on the surface of the p-type substrate 801. And further, p+-type pixel isolation regions 810 are formed thereby to divide the n+-type pixel regions 804.

In a modified example, shown by FIG. 9f and FIG. 9g, which are a cross-sectional view and a sectional view taken by a sectional plane C—C' of FIG. 9a and another cross-sectional view taken by a cross-section G—G' on FIG. 9f and further shown by FIG. 9i, rectangular parallelo piped shaped recesses 513 or trench of (width w)×(length v)×(depth h) are made to improve resolution power of the picture, and n+-type regions 808 are made to surround the trenches 513. P+-type regions 809 are pixel-dividing channel stopper regions.

Operations of the example of FIG. 9a through FIG. 9e and also of FIG. 9f and FIG. 9g are elucidated with reference to the pulse waveform diagram of FIG. 9h. A pair of pulse train signals φ1 and φ2 are impressed on the first polysilicon region 806 and the second polysilicon region 807 as the gate electrodes, or vice versa. Then, by means of larger pulses $V_H$ of φ1 and φ2, charges which are made by photoelectric conversion and stored in the n+-regions 804 or 808 are transferred (namely read out) to the charge transfer region 811 in the n-type regions 802. And then the read out charge is transferred in a lengthwise direction of the oblong groove 511.

As mentioned above, in the above-mentioned examples, when a process of a level of manufacturing 4 Mb DRAM, the width X of some of read- out gate regions 812 and CCD parts are within only about 4 μm, in case where a two dimensional imaging device is made by forming the above-mentioned examples in continuity in lateral direction and in longitudinal direction of the oblong groove, the aspect ratio of a CCD having ⅔ inch light receiving area was about 80% and that of ½ inch light receiving area was about 78% (when width of the element isolation region was 0.8 μm and channel length of the read out gate region was 1.6 μm). This value of the aspect ratio is about 3.5–4 times that of the conventional CCD. Accordingly, it is possible to raise the sensitivity of the imaging device to about four times higher even though the number of picture elements of the CCD is unchanged, or alternatively the number of picture element can be increased to about 2.5 times when the sensitivity of the imaging device is retained unchanged. That is, for a ⅔ inch CCD wherein the conventional imaging apparatus has 500×500 pixels, an increased number of 800×800 pixels are obtainable while retaining the same sensitivity. Alternatively, if a CCD imaging apparatus of 1 inch size is manufactured while retaining the same sensitivity, the 1 inch CCD can have 1600×1600 pixel elements. Thus, the technology of this embodiment according to the invention can achieve a great picture quality improvement or sensitivity improvement.

Figure 10A:
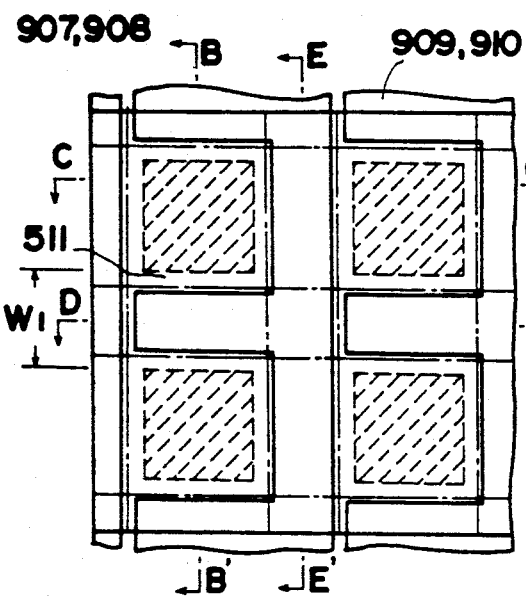
FIG. 10a through FIG. 10g show a fifth embodiment of the imaging device.
Figure 10B:
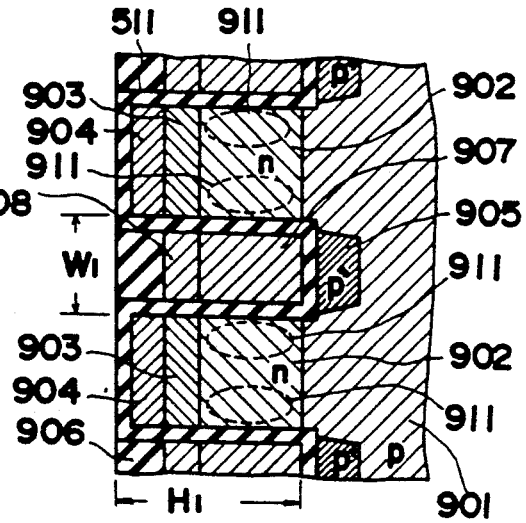
Figure 10C:
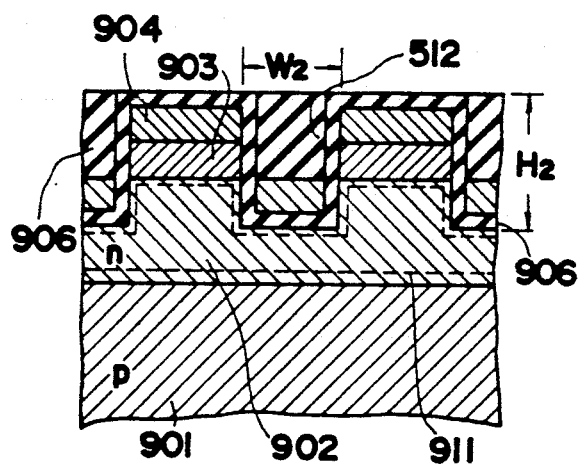
Figure 10E:
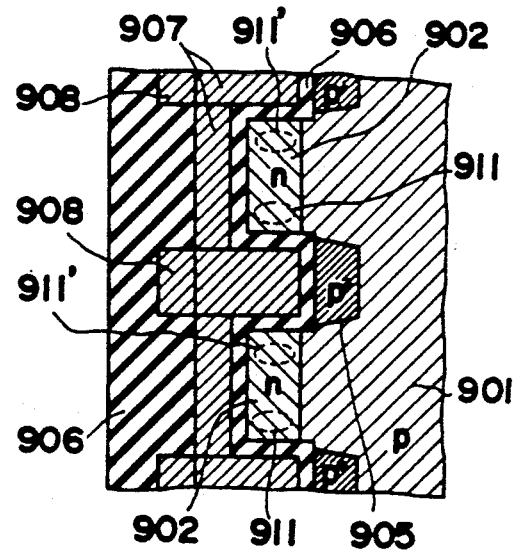
Figure 10D:
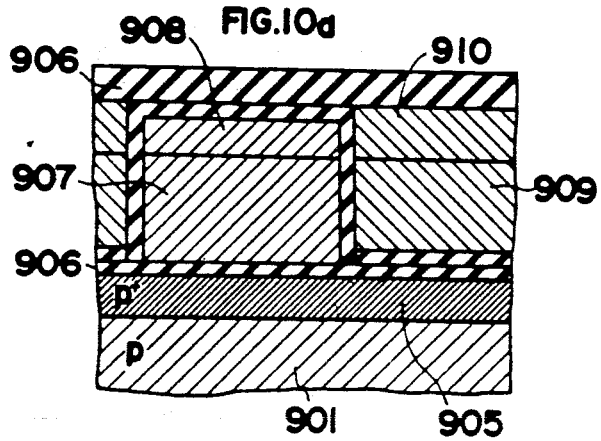

FIG. 10a through FIG. 10g show a fifth embodiment of the imaging device. FIG. 10a is a plan view of the device. FIG. 10b is a cross-sectional view taken by a plane shown by sectional line B—B' on FIG. 10a. FIG. 10c is a cross-sectional view taken by a plane shown by sectional line C—C' on FIG. 10a. FIG. 10d is a cross-sectional view taken by a plane shown by a sectional line D—D' on FIG. 10a. FIG. 10e is a cross-sectional view taken by a plane shown by sectional line E—E' on FIG. 10a. As shown in FIG. 10a through FIG. 10e, a substrate 901 of p-type semiconductor has n-type high resistivity semi-conductor region 902, p-type region 903 as a read-out gate region formed thereon, and n+-type region 904 further formed thereon and further has at least one oblong trench or groove 511 of width $W_1$ and depth $H_1$ having substantially vertical walls reaching to the bottom of the n-type region 902. Crossing over the groove 511 and partly filling therein, at least one first polycrystalline region 907, 908 and a second polysilicon region 909 and 910 are formed, isolated by insulation film 906 therearound; so that the first polysilicon region 908 and 907 and the second polysilicon regions 909 and 910 are insulated from each other and from the substrate 901 by the insulation film 906, thereby to form gate electrodes. Further, p+-type channel stopper regions 905 are formed along and under the bottoms of the first oblong grooves 511 the first polysilicon region 908 and the second polysilicon region 910, which also constitute a reading gate region. Further, in a direction to perpendicularly cross the first grooves of width $W_1$, second grooves 512 of width $W_2$ and depth $H_2$ are formed as shown in FIG. 10a and FIG. 10c. Regions 911 and 911' shown by the dotted elliptic line are depletion regions to be used as charge transfer regions which are produced in the principal operation state. When voltage transfer gate electrodes are large, the charge transfer regions 911 and 911' sometimes may merge into one region.

Operation of this embodiment is substantially the same as the foregoing fourth embodiment. The difference of this embodiment is that since the reading gate regions 903 are provided on the inner walls of the grooves in this embodiment, higher integration becomes possible.

Figure 10G:
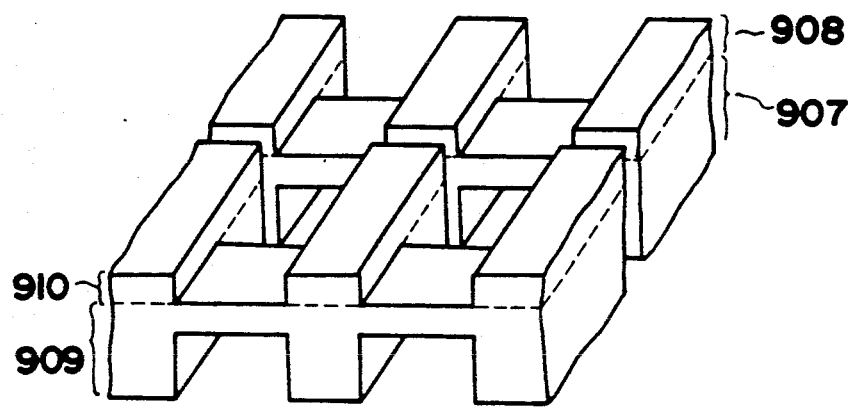

When a manufacturing process corresponding to the conventional 4 Mb DRAM, whereby width $W_1$ and $W_2$ of 0.8 μm is obtainable, the aspect ratio of ⅔ inch CCD becomes 89%, and the aspect ratio of the ½ CCD becomes 87%, and both embodiments have improvement by about 9% in aspect ratio in comparison with the foregoing fourth embodiment. FIG. 10f and FIG. 10g show a knocked down perspective view of the semiconductor device of this embodiment wherein FIG. 10f shows a lower part comprising the substrate and the overriding semiconductor regions, and FIG. 10g shows the overriding part comprising the polysilicon gate electrodes shown with the further overriding insulation films 906.

Furthermore, the manufacturing process of this embodiment is simpler in comparison with the manufacturing process of the foregoing fourth example, as will be clear from the following detailed explanation of the manufacturing process of this embodiment made with reference to FIG. 11a, FIG. 11b, FIG. 11c, FIG. 11d, FIG. 11e, FIG. 11f, FIG. 11g, FIG. 11h, FIG. 11i, FIG. 11j-1, FIG. 11j-2, FIG. 11k-1, FIG. 11k-2, FIG. 11k-3, FIG. 11l-1, FIG. 11l-2, FIG. 11l-3, FIG. 11m-1, FIG. 11m-2, FIG. 11m-3, FIG. 11n-1, FIG. 11n-2 and FIG. 11n-3.

Figure 11A:
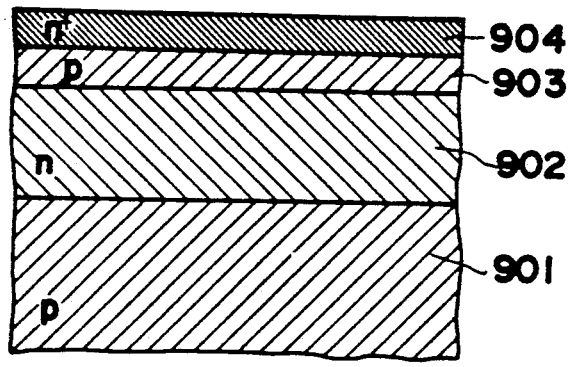

The manufacturing process of the semiconductor device shown by FIG. 10a through FIG. 10e is elucidated with reference to the drawings FIG. 11a through FIG. 11n-3.

(1) As shown in FIG. 11a, on a p-type semi-conductor substrate 901, an n-type high resistivity region 902 (having impurity concentration N of $N < 10^{15} cm^{-3}$) was made by vapor phase growth method or the like, and subsequently p-type region 903 (having impurity concentration N of ($10^{15} < N < 10^{17} cm^{-3}$), and further thereon n+-region 904 (of impurity concentration N of $10^{17} < N < 10^{19} cm^{-3}$) by thermal diffusion or vapor phase growth or ion implantation process. Besides, other methods are usable, for instance, after forming the n+-region 904 the p-type region 903 may be made by ion implantation.

Figure 11B:
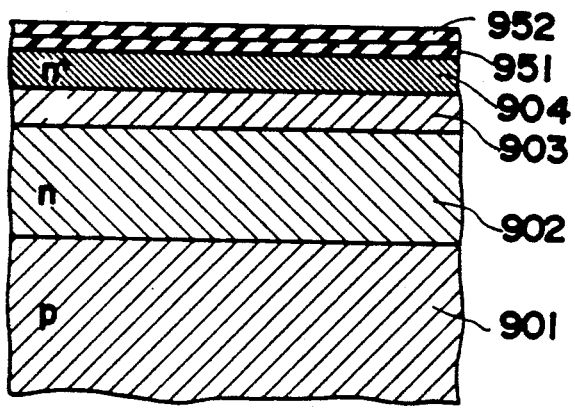

(2) As shown in FIG. 11b, on the surface of the n+-type region 904, an oxide film 951 (of thickness t of about 1000Å), and thereon a nitride film 952 (of thickness t of 1000Å $< t <$ 2000Å) was made by thermal oxidation and subsequent CVD process.

Figure 11C:
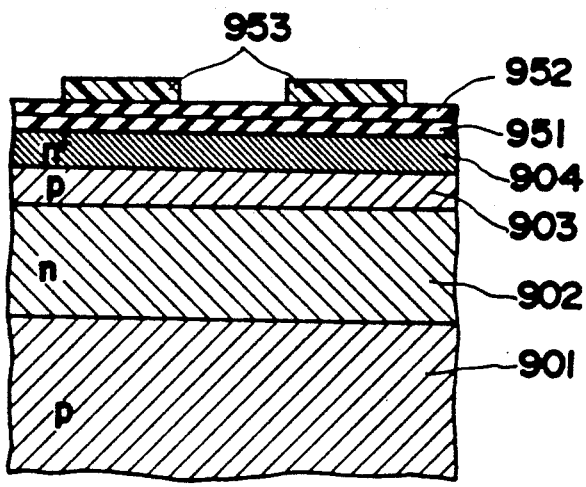
Figure 11A:
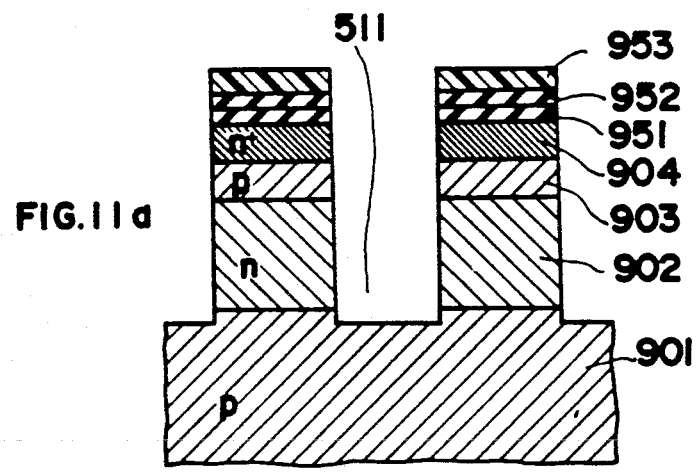

(3) As shown in FIG. 11c, a known photoresist film was formed by ordinary photolithograph process.

(4) As shown in FIG. 11d, by means of plasma etching, sputter etching or chemical etching, the nitride film 952, the oxide film 951 and then the n+-type region 904, p-type region 903 and the n-type region 902 are removed by means of directional etching process so that etched walls become substantially perpendicular to the principal face of the substrate. Alkaline etching or plasma etching may be used as the directional etching process.

Figure 11E:
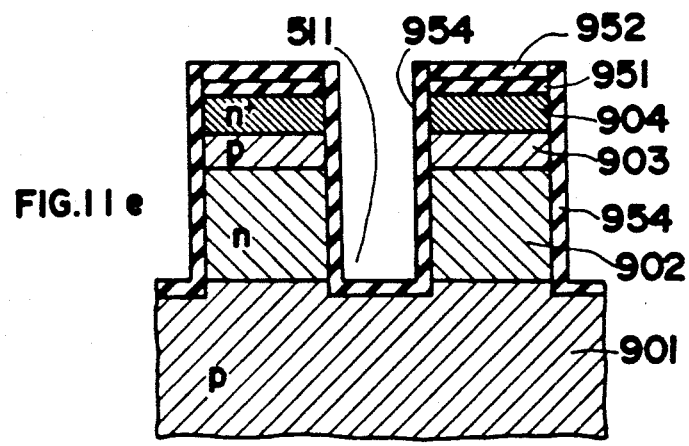

(5) As shown in FIG. 11e, oxide films are formed on vertical walls made by the directional etching similar to that in the step FIG. 11d, by means of thermal oxidation or the like known method.

Figure 11F:
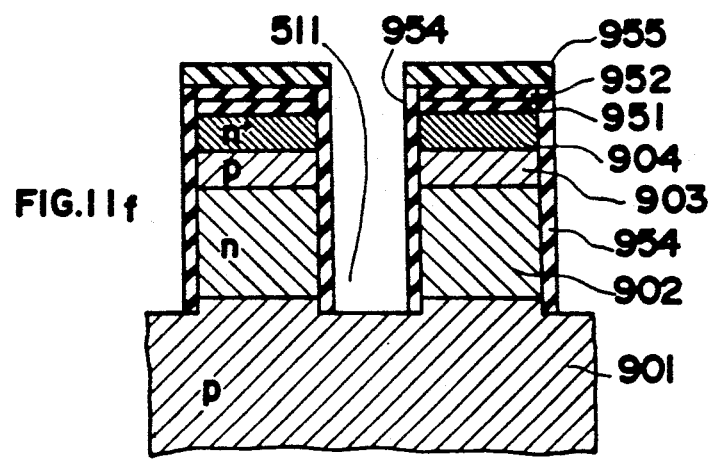
Figure 11:
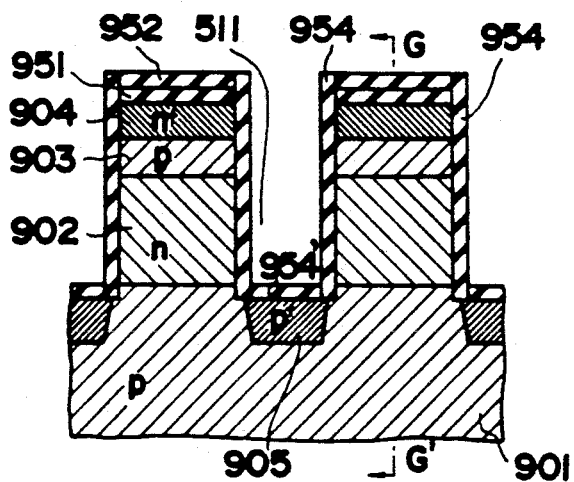
Figure 11:
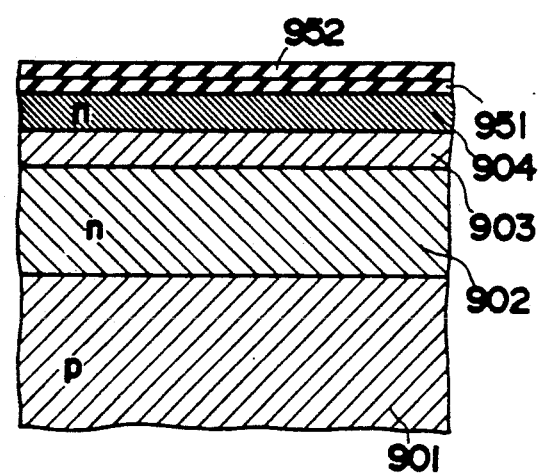
Figure 11:
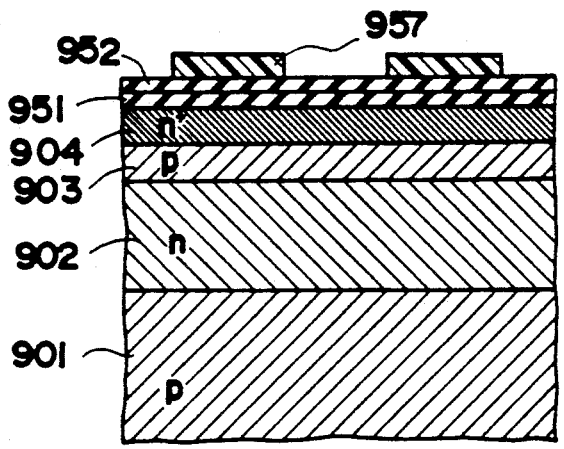
Figure 11:
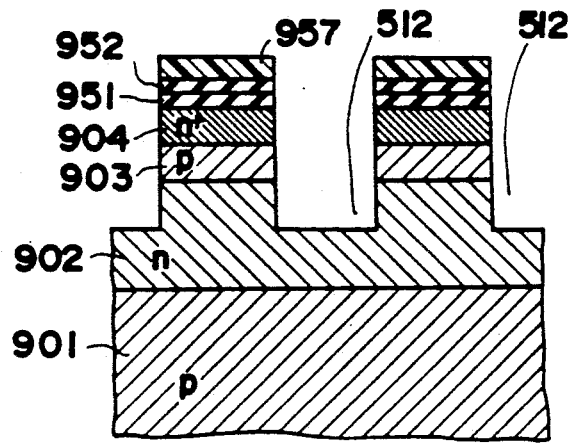
Figure 11:
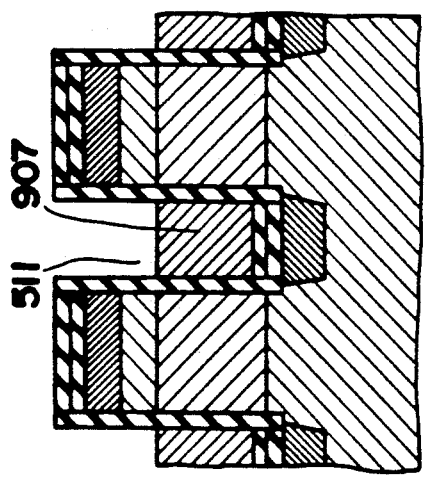
Figure 11:
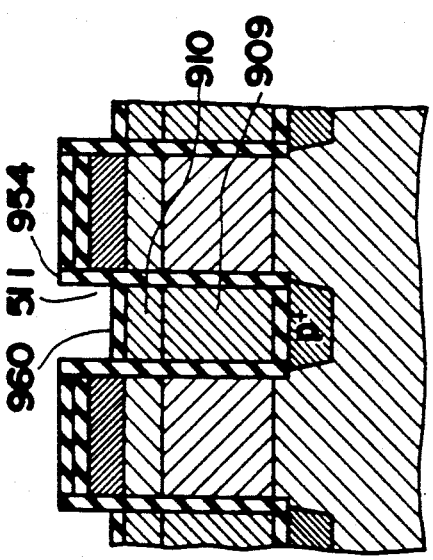
Figure 11:
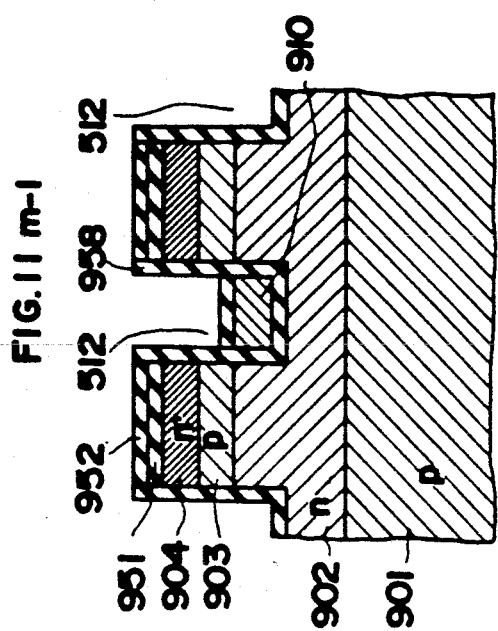
Figure 11:
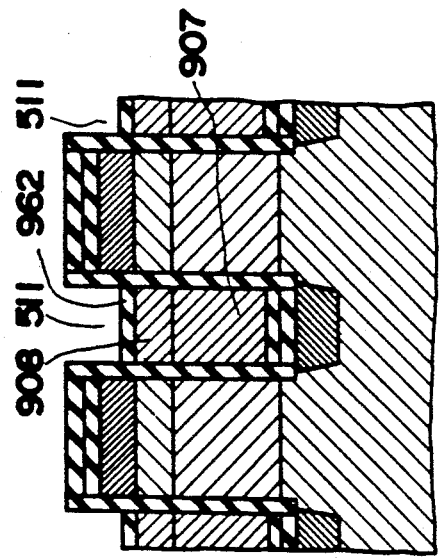
Figure 11:
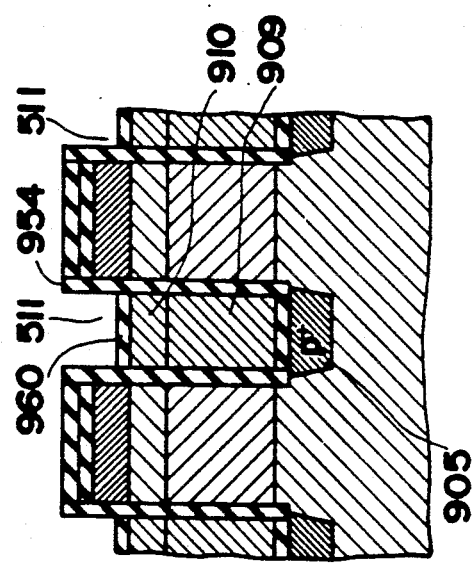
Figure 11:
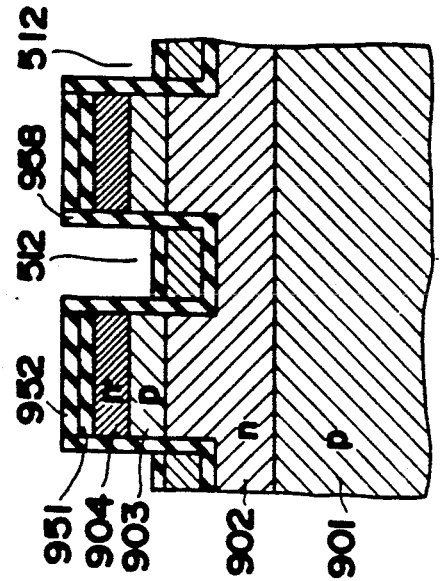

(6) As shown in FIG. 11f, photoresist film 955 was formed by known photolithographic process, and then the oxide film 954 at the bottom of the etched groove 511 was removed by the directional etching process.

(7) As shown in FIG. 11g-1, after removing the photoresist 955, p+-type region 905 (having impurity concentration of over $10^{20} cm^{-3}$) was formed at the bottom part of the groove 511, then the oxide film 954 was removed in the step of FIG. 11f, by thermal diffusion or ion implantation. Thereafter, by thermal oxidation or the like, oxide film 954' was made again on the bottom face, namely, on the upper face of the p+-type region 905. FIG. 11g-2 is a sectional view taken at sectional plane G—G' on FIG. 11g-1.

(8) As shown in FIG. 11h, photolithographic film 957 was made by ordinary photolithographic process.

(9) As shown in FIG. 11i, by using the same directional etching as described with reference to FIG. 11d and the foregoing step (4), a second groove 512 was made until midway deep in the n-type region 902 by the directional etching process in a manner that the etched walls are substantially perpendicular to the principal surface of the substrate.

(10) As shown in FIG. 11j-1, in the second etched grooves 512, an oxide film is formed by thermal oxidation or the like known method. A sectional view, taken by J—J' cross-sectional plane shown in FIG. 11j-1, is shown in FIG. 11j-2.

(11) As shown in FIG. 11k-1, FIG. 11k-2 and FIG. 11k-3, wherein FIG. 11k-2 is the sectional view at sectional plane K—K' of FIG. 11k-1 and FIG. 11k-3 is the sectional view at sectional plane L—L' of FIG. 11k-1, the first polysilicon region 909 was filled in the first groove 511 up to the level of the upper surface of the n-type region 902. This process is made for instance, by a process that after applying polyimide or the like resin all over the substrate, a photoresist pattern is formed in a manner to expose the polyimide layer at the parts of the first groove 511 where the first polysilicon 909 is to be filled, and sputtering or a CVD process is carried out to vary the first polysilicon region 909.

(12) As shown in FIG. 11l-1, FIG. 11l-2 and FIG. 11l-3, which correspond to the sectional views FIG. 11k-1, FIG. 11k-2 and FIG. 11k-3, respectively, on the first polysilicon region 909, another polysilicon region 910 was formed up to the surface level of the p-type region 903. The same process as shown in the previous step (11) can be used. And thereafter oxide film 960 was made by thermal oxidation or the like method.

(13) As shown in FIG. 11m-1, FIG. 11m-2 and FIG. 11m-3, which are further steps from FIG. 11l-1, FIG. 11l-2 and FIG. 11l-3, respectively, by using the same step as described in the step 11 with reference to FIG. 11k-1, FIG. 11k-2 and FIG. 11k-3, the second polysilicon regions 907 are filled in the rest grooves 512.

(14) As shown in FIG. 11n-1, FIG. 11n-2 and FIG. 11n-3, similarly corresponding to the foregoing sectional planes, second polysilicon region 907 are formed up to the surface of the p-type region 903, and then oxide film 962 was formed by thermal oxidation and the like method. Thereafter, by applying polyimide resin all over the surface of the substrate as an insulation material, the CCD imaging device, as shown by FIG. 10a through FIG. 10e, is completed.

Figure 10:
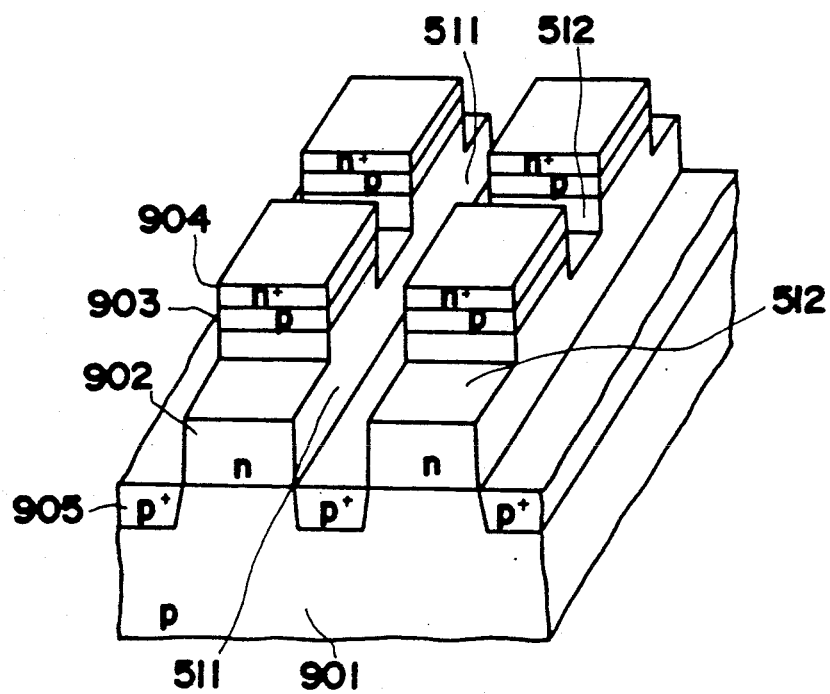
Figure 12:
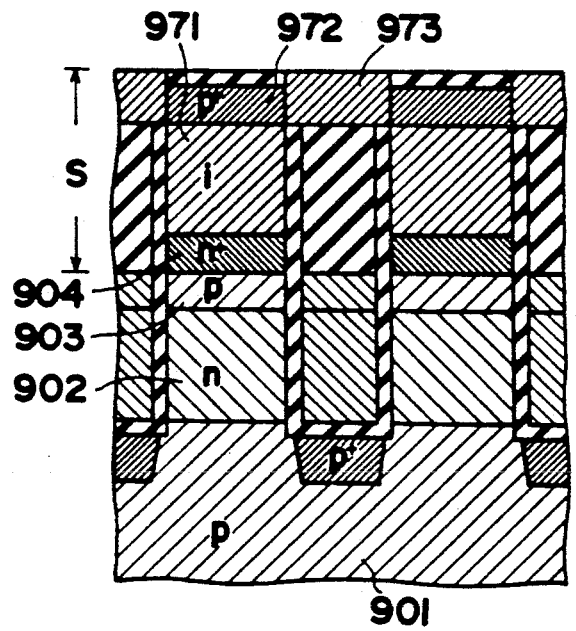
FIG. 12 shows a modified example of the CCD imaging device, modified from the device of FIG. 10.

FIG. 12 shows another modified example of the CCD imaging device, modified from the device of FIG. 10, wherein a pin photo-diode may be formed in the upper part, shown as S in FIG. 12, as a photoelectric conversion part. That is, in the configuration of FIG. 12, on the semi-conductor CCD device, as has been described on the preceding embodiments, a pin photo-diode designated as S is formed. The pin photo-diode comprises n+-type region 904, i-type 971 (having impurity concentration N of $N < 10^{14} cm^{-3}$) formed thereon and p+-type region 972 (impurity concentration N is $N > 10^{19} cm^{-3}$) formed thereon, and further thereon a metal electrode 973.

Figure 13:
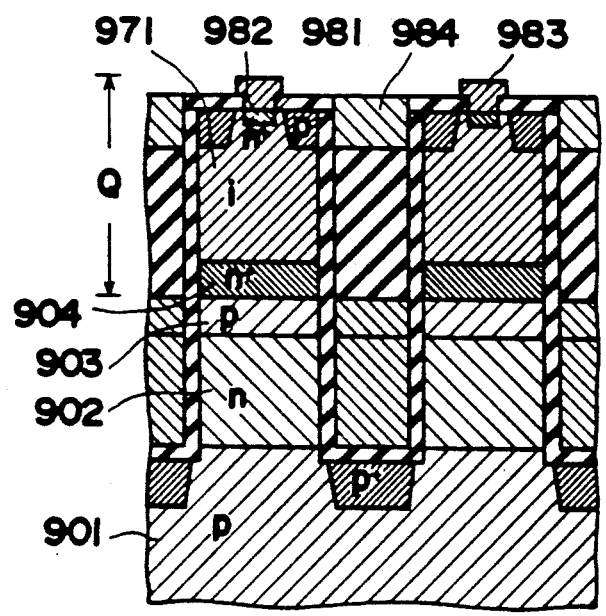
FIG. 13 shows still other modified example wherein on the same semiconductor CCD device as the preceding examples.

FIG. 13 shows still other examples wherein, on the same semiconductor CCD device as the preceding examples, an SIT (Static Induction transistor) phototransistor may be formed. In this SIT phototransistor, numeral 981 designates a p-type region to serve as a gate region, numeral 982 designates a n+-type source region, numeral 983 designates a source electrode and numeral 984 designates a gate electrode.

As has been described on various examples, drastic improvement in sensitivity in the CCD imaging apparatus and improvement of the resolution power is achievable since sufficient dynamic range is obtainable with a light receiving part having a small area by making the CCD device along the groove formed on the semiconductor substrate.

Next several embodiments of MOS type imaging devices using a trench or groove to produce charge transportation regions are described.

FIG. 14a through FIG. 14g show a sixth embodiment of the semiconductor device in accordance with the present invention, and therein:

FIG. 14a is a plan view of the device.

FIG. 14b is a cross-sectional view taken at B—B' sectional plane shown in FIG. 14a.

FIG. 14c is a cross-sectional view taken at C—C' sectional plane shown in FIG. 14a.

FIG. 14d is a cross-sectional view taken at D—D' sectional plane shown in FIG. 14d.

FIG. 14e, FIG. 14f and FIG. 14g are energy band diagrams on C—C' cross-section of FIG. 14b.

FIG. 14h is a cross-sectional view of a modified embodiment from the embodiment of FIG. 14a through FIG. 14g, taken similarly to the cross-sectional view of FIG. 14b.

Figure 14:
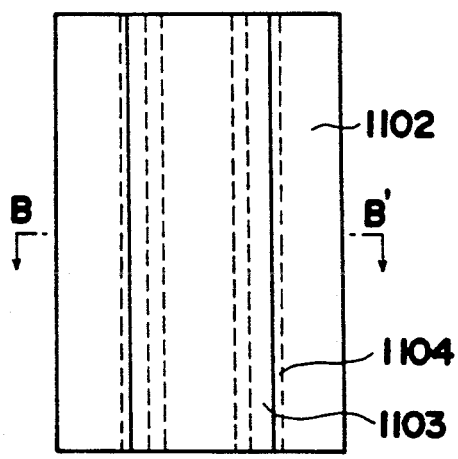
FIG. 14a through FIG. 14g show a sixth embodiment of the semiconductor device in accordance with the present invention, and therein.
FIG. 14h is a cross-sectional view of a modified embodiment from the embodiment of FIG. 14a through FIG. 14g, taken similarly to the cross-sectional view of FIG. 14b.
Figure 14:
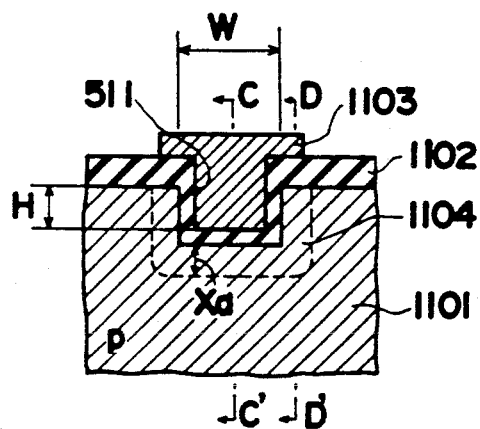
Figure 14:
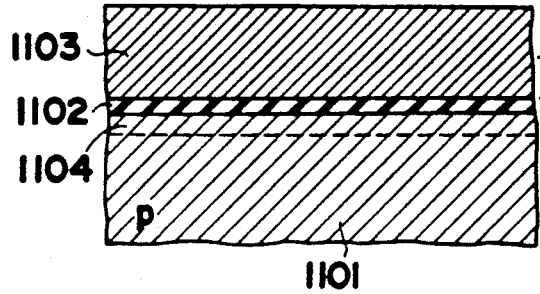
Figure 14:
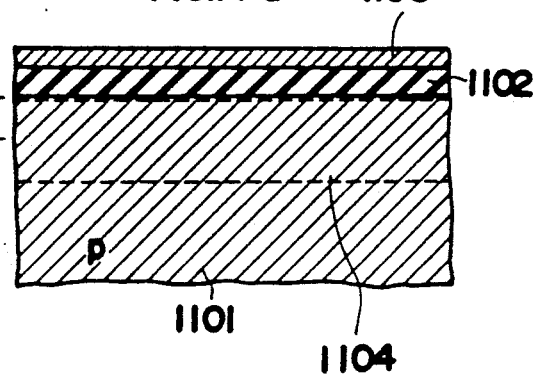

In FIG. 14, on a p-type semiconductor substrate 1101 of high resistivity silicon, an oblong trench or groove 511 of width W and depth H are made to have a substantially vertical wall, and therein insulation film 1102 and polysilicon gate electrode 1103 are formed. A region 1104, shown by broken line, is a charge depletion layer which appears in the principal operation state, and energy band diagram of FIG. 14e corresponds thereto, and the charge depletion region becomes a signal transmission line when electric charges are stored therein as shown in FIG. 14f designated by the region 1105. When a potential impressed on the polysilicon gate electrode 1103 is high, an inversed layer is formed as shown as a region 1106 in FIG. 14g, and a large amount of electrons exist therein.

Such a charge depletion region with a large amount of electrons works as an electric charge transportation region like a metal wire.

FIG. 14h is a modified embodiment wherein by providing a channel stopper of p+-type region 1107, two depletion regions 1108 and 1109 are separately formed and these two depletion regions 1108 and 1109 are usable for individual signal transportation regions.

As a further modified example, in place of the p+-type channel stopper region 1107, a thick insulation film formed at the same place can be used to divide the two depletion regions.

The operation of the above-mentioned semi-conductor device is described hereafter.

When a positive voltage $V_G$ is impressed on the polysilicon gate electrode 1103 as a gate voltage, (if the substrate is of p-type, a negative gate voltage $V_G < 0$ must be impressed), then the width $x_d$ of the depletion layer is given by the following equation $$x_d = \sqrt{\frac{2K_s\epsilon_o}{e(N_A - N_D)} V_s} \quad (1)$$

wherein: e: amount of electron charge,
$K_s$: specific dielectric constant of the,
$\epsilon_o$: dielectric constant of vacuum,
$N_A$: acceptor concentration,
$N_D$: doner concentration,
$V_S$: height of barrier (shown in FIG. 1e).

That is, when the gate voltage $V_G$ increases, the barrier height $V_S$ increases, and hence, as is derived from the equation (1), the width $x_d$ of the depletion layer increases. When the gate voltage $V_G$ becomes equal to threshold voltage $V_T$, as shown in FIG. 14g, the inverse layer appears, and therefore the depletion layer width $x_d$ converses to a certain value $x_{dmax}$.

Provided that potentials inside the semiconductor and the surface are $\phi_s$ and $\phi_b$, respectively, the height of barrier $V_S$ is expressed as $V_S = \phi_s - \phi_b$, and when $x_d$ is $x_{dmax}$, becomes $V_S = -2\phi_b$, and therefore the $x_{dmax}$ is given by the following equation:

$$x_{dmax} = \sqrt{-\frac{4K_s\epsilon_o}{e(N_A - N_D)} \phi_b} \quad (2)$$

The capacitance $C_{SC}$ of the depletion layer corresponding to $x_d$ of the equation (1) is given as follows:

$$C_{SC} = \frac{K_s\epsilon_o}{x_d} = \sqrt{\frac{eK_s\epsilon_o(N_A - N_D)}{2V_S}}. \quad (3)$$

By storing a predetermined amount of electric charge $Q_0$ in this depletion layer, quite similarly to the case of signal transmission on metal wire, a variation of potential can be conveyed to a remote place through electrons stored in the depletion layer. The difference of this signal transportation through the depletion layer from the case of the metal signal transmission line is that the former has no movement of electrons through the metal-semiconductor interface, and therefore there is no fear of noise making, and this system is strong against chemical contamination.

As has been described in the examples, by making an oblong trench or groove on a surface of a high resistivity semiconductor layer, forming a gate electrode in the groove with insulation film therebetween, and impressing a gate voltage $V_G$ on the gate electrode, a depletion layer is formed along the insulation layer in the semiconductor; and by storing electrons in this depletion layer it is usable as a signal transmission line.

The dynamic range of the signal transmission line made in this way depends on the depth H of the groove and the width W of the groove can be about 0.8 μm with 4 Mb-MOS DRAM manufacturing technology, and the depletion layer signal transmission line has advantages over the ordinary wire signal transmission line formed on the semiconductor substrate, without necessity of contact and no existence of a step part on the semiconductor surface, and hence simplifies the manufacturing process and improves of reliability of the device.

FIG. 15a through FIG. 15g shows a seventh embodiment of the semiconductor device in accordance with a present invention, wherein FIG. 15a is a plan view, FIG. 15b is a cross-sectional view taken at a sectional plane B—B' of FIG. 15a, FIG. 15c is a cross-sectional view taken at a sectional plane C—C' of FIG. 15a, FIG. 15d is a cross-sectional view taken at a sectional plane D—D' of FIG. 15a, FIG. 15e, FIG. 15f and FIG. 15g are energy band diagram at the sectional plane C—C' of FIG. 15b. In FIG. 15a through FIG. 15d, a high resistivity n-type semiconductor layer 1202 formed on a p-type substrate 1201 has at least one oblong groove 511 of width W and depth H. The bottom face of the groove 511 may reach the p-type substrate 1201. Over and along the inside of the groove 511, a polysilicon region 1204 is provided, being isolated by insulation film 1203. Further, p+-type channel stopper region 1205 is formed along and under the bottom of the oblong groove 511. Then, on both outside faces of the insulation film 1203 on the vertical wall of the groove 511 but slightly apart from both sides of the vertical walls, a pair of buried channels 1206 and 1207 are formed in the principal operation state, which becomes a signal transmission line by storing electrons therein.

An operation of this embodiment as configurated above is described. Width $x_d$ of the depletion region corresponding to impressed voltage $V_G$ is represented as follows:

$$x_d = \frac{-\frac{e(N_A - N_D)}{2K_S} + \sqrt{\left(\frac{e(N_A - N_D)}{2K_S}\right)^2 - \frac{4e(N_A - N_D) \cdot t_{OX}}{\epsilon_o}(V_G - V_{FB})}}{2 \cdot \frac{e(N_A - N_D) \cdot t_{OX}}{\epsilon_o}}. \quad (4)$$

wherein,
$V_{FB}$: flat band voltage,
$t_{OX}$: thickness of oxide film under the gate electrode.

On the other hand, by means of forming a pn junction between the n-type region 1202 and p-type substrate 1201, another depletion layer having width $x_d'$ represented as follows is produced in the n-type region 1202:

$$x_d' = \sqrt{\frac{2K_s\epsilon_o}{e(N_D - N_A)} \phi_o}. \quad (5)$$

wherein, $\phi_0$ is a difference of potential at the interface between the n-type region 1202 and the p-type substrate 1201 and another potential at the second depletion layer of depth $x_d'$ in the n-type region.

Owing to the existences of the depletion layers of width $x_d$ and $x_d'$, the energy band diagram, as shown in FIG. 15e, is made, and storing electrons in the region M becomes possible. The state of FIG. 15e corresponds to the case of $0 < V_G < < V_{FB}$ and the case of FIG. 15f corresponds to the state of $0 < < V_G < V_{FB}$, and FIG. 15g shows the state where electrons are stored in the region M.

As described above, according to this embodiment, by making the conductivity type of the high resistivity semiconductor region n-type, a signal transmission line of the type of buried channel is produced, which can evade undesirable influence of crystal imperfection or the like at the surface of the groove 511, and therefore this signal transmission line is advantageous in lowering noise.

Figure 16:
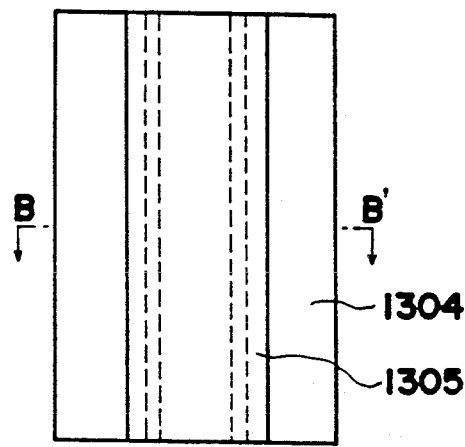
Figure 16:
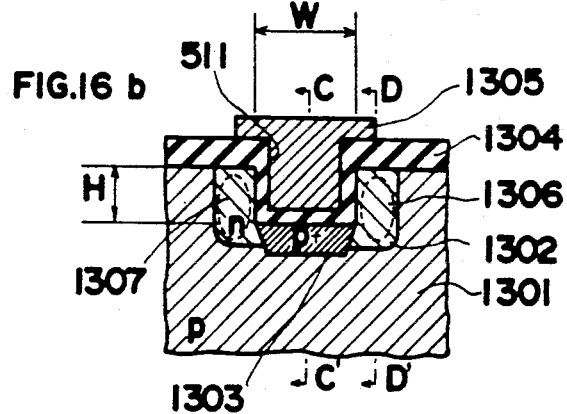
Figure 16:
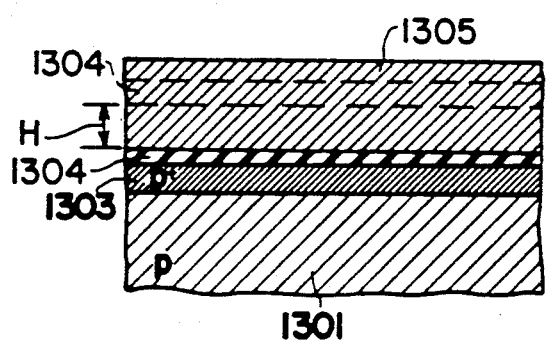
Figure 16:
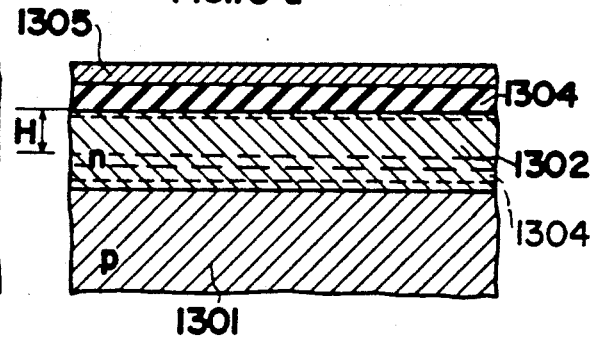

FIG. 16a through FIG. 16d show an eighth embodiment in accordance with the present invention; wherein FIG. 16a is a plan view, FIG. 16b is a cross-sectional view taken at a sectional plane B—B' of FIG. 16a, FIG. 16c is a cross-sectional view taken at a sectional plane C—C' of FIG. 16a, FIG. 16d is a cross-sectional view taken at a sectional plane D—D' of FIG. 16a.

In FIG. 16a through FIG. 16d, on a p-type semiconductor substrate 1301, an oblong trench or groove 511 of width W and depth H are made to have a substantially vertical wall. A high resistivity n-type region 1302 is formed around the groove 511 and therein insulation film 1304 and polysilicon gate electrode 1305 are formed. Further, under the bottom of the groove 511, p+-type region 1303, as a channel stopper, is formed by a known thermal diffusion method or ion implanatation method. Futhermore, on both outside sides of the groove 511, n-type regions 1302 are formed by a known method. Regions designated by elliptic broken lines 1306 and 1307 show buried channels which are to be produced in the principal operation state. These buried channels 1306 and 1307 become signal transmission lines by storing electrons therein.

Figure 15:
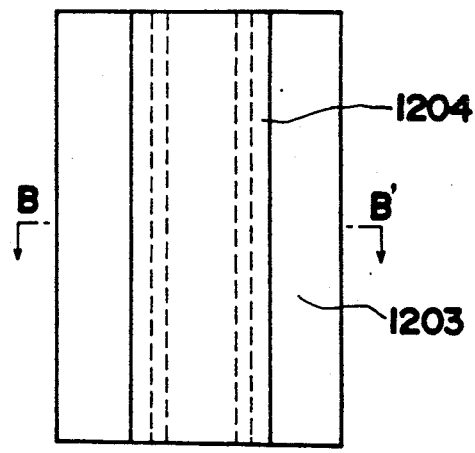
Figure 15:
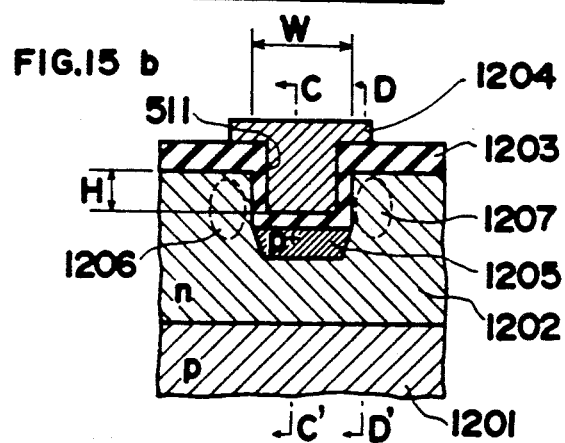
Figure 15:
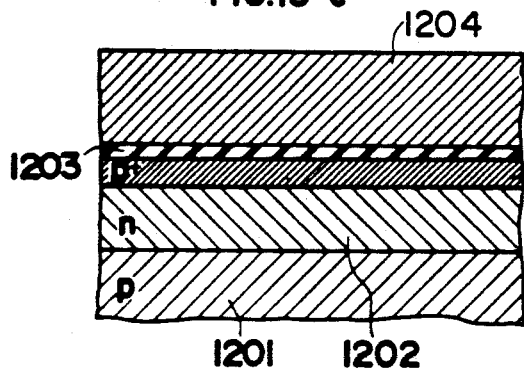
Figure 15:
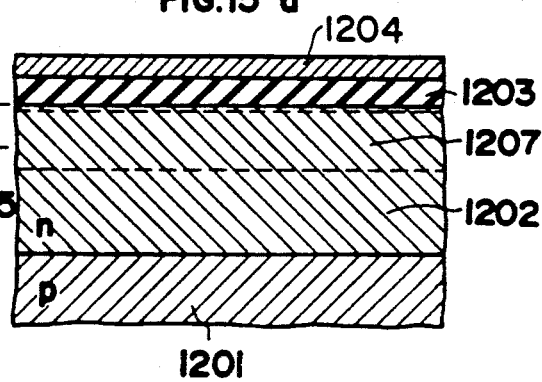
Figure 15:
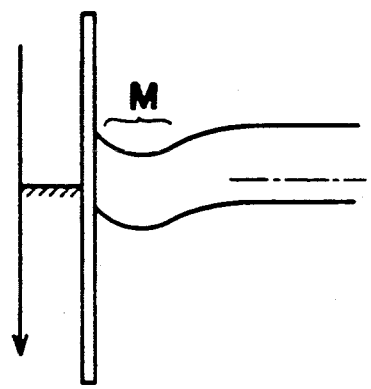
Figure 15:
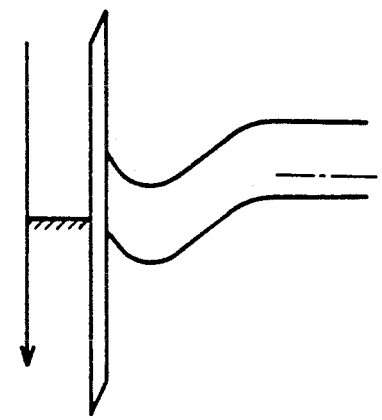
Figure 15:
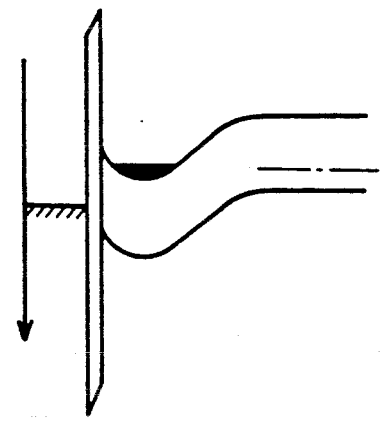

The difference of this eighth embodiment of FIG. 16a through 16d from the foregoing seventh example of FIG. 15 is that the n-type regions are provided in two divided regions in this embodiment, and such difference is appropriately selected depending on use and process.

Figure 17:
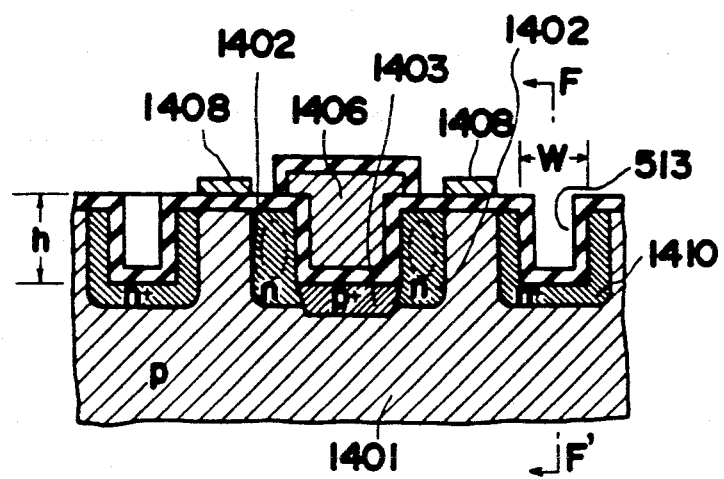
Figure 17:
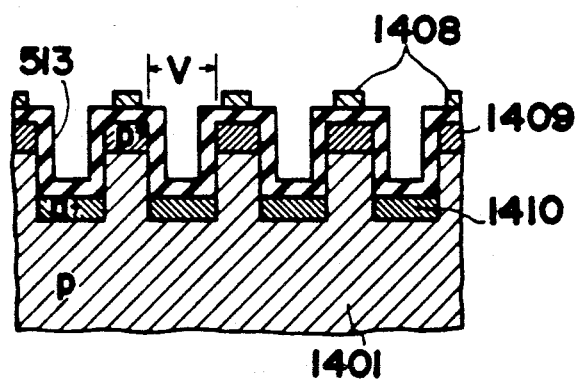

FIG. 17a through FIG. 17f show a ninth embodiment of the semiconductor imaging device in accordance with the present invention; wherein FIG. 17a ia a plan view, FIG. 17b is a cross-sectional view taken at a sectional plane B—B' of FIG. 17a, FIG. 17c is a cross-sectional view taken at a sectional plane C—C' of FIG. 17a, FIG. 17d is a cross-sectional view taken at a sectional plane D—D' of FIG. 17a. FIG. 17e and FIG. 17f show a modified example of FIG. 17, wherein: FIG. 17e is a cross-sectional view taken at cross-section B—B' on FIG. 17a and FIG. 17f is a cross-sectional view of the modified embodiment taken at sectional plane F—F' on FIG. 17e.

In the figures of FIG. 17a through FIG. 17d, on a surface of p-type semiconductor substrate 1401, an oblong trench or groove 511 having width W and depth H is formed to have a substantially vertical wall, and therein insulation film 1407 and polysilicon gate electrode 1406 are formed. Further under the bottom of the groove 511, p+-type region 1403 as a channel stopper is formed by known thermal diffusion method or ion implantation method. Furthermore, on both outside sides of the groove 511, n-type regions 1402 are formed by a known method. Regions designated by elliptic broken lines 1411 and 1412 show buried channels which are to be produced in the principal operation state. These buried chanels 1411 and 1412 become signal transmission lines by storing electrons therein.

On the other hand, on the p-type substrate 1401, a n+-type region 1404 for making pn junction for working photoelectric conversion region of photo-diode is formed, which are divided into plural photo-diode regions by encircling p+-regions 1409 as pixel separation channel stoppers. Thereafter, an insulation films 1405, the first polysilicon gate electrode 1406, and further, a second polysilicon gate electrode 1408 are formed.

FIG. 17e and FIG. 17f show the modified embodiment wherein n+-regions 1410 are formed in the bottom of the trenches 513 having width w and length v and depth h, so that a photoelectric conversion region is formed thereby.

The operation of the above-mentioned embodiment semiconductor imaging device is described. When readout pulses are impressed on the second polysilicon gate electrode 1408, signal electric charges are transported from the n+-type region 1404 of the photo-diode to the n-type region 1402. The n-type region 1402 was made in depletion state by impressing the gate voltage by the first polysilicon gate electrode 1406, thus forming the depletion regions 1411 and 1412. Electrons are stored in the depletion regions 1411 and 1412 to make it a transmission lines, signal transmission occurring in a lengthwise of the groove 511 thereby to convey a potential variation to remote detection means.

As mentioned above, according to the configuration of the present embodiment, contact of metal as a signal transmission line on semiconductor which becomes necessary in conventional large scale IC becomes unnecessary, and the oblong region, which is equivalent to the signal transmission line, can be formed inside the semiconductor substrate, and therefore the signal transmission means can be formed with a flat process, and reliability of the semiconductor device increases greatly.

Figure 18A:
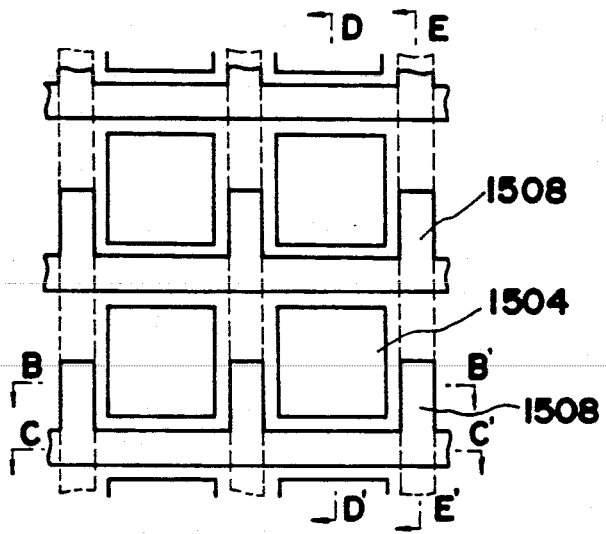
Figure 18B:
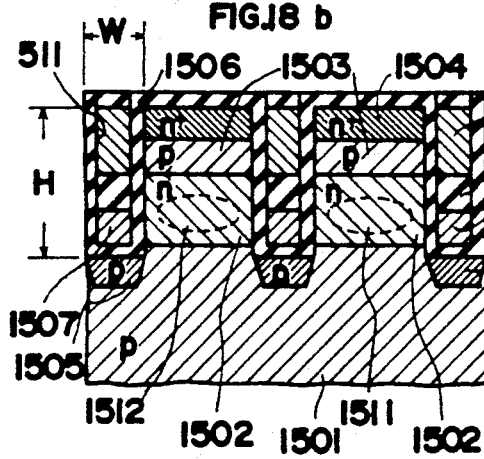
Figure 18D:
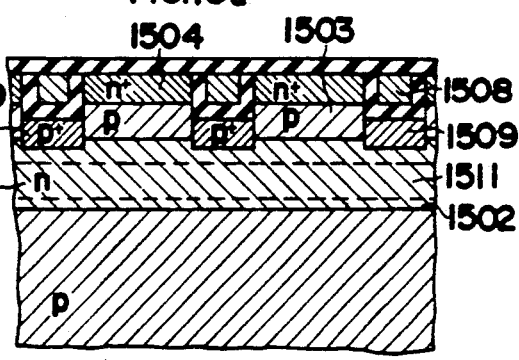
Figure 18C:
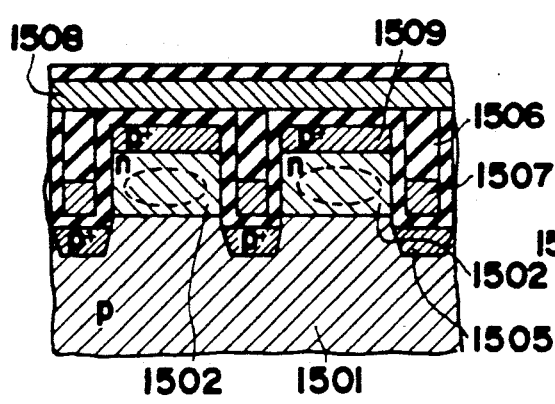
Figure 18E:
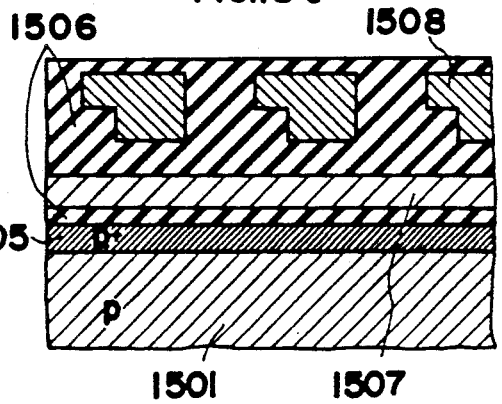
Figure 18G:
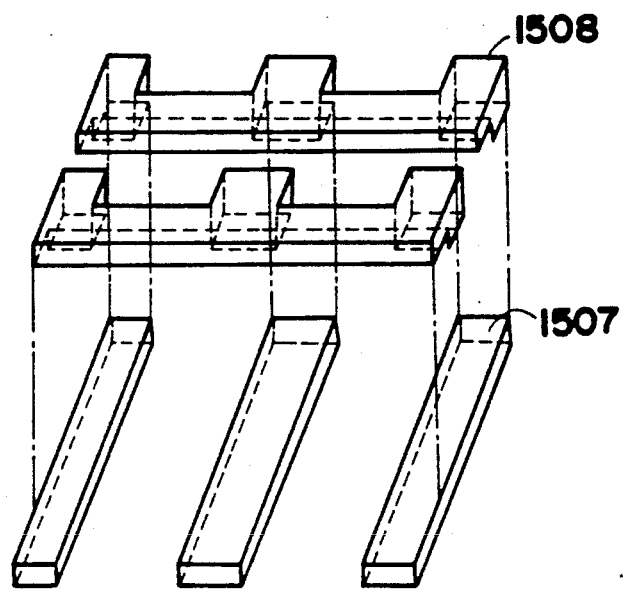
Figure 18:
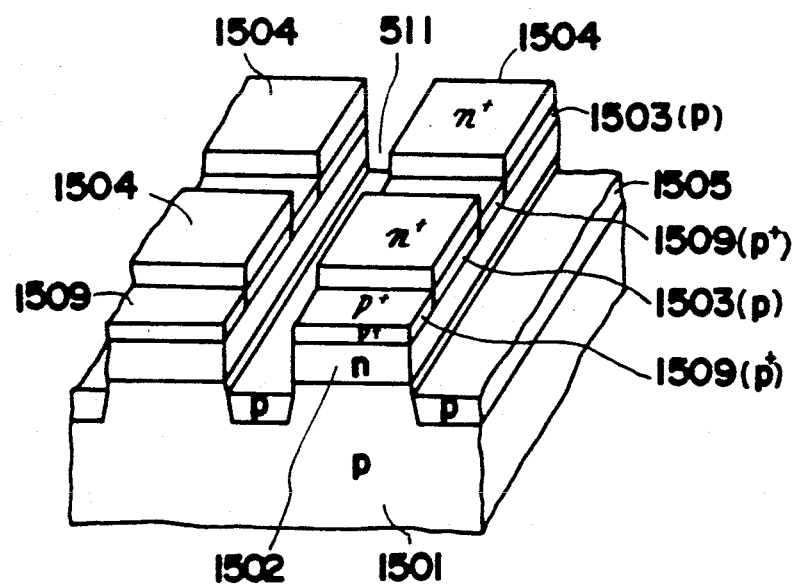

FIG. 18a through FIG. 18g show a tenth embodiment of the semiconductor device in accordance with the present invention; wherein FIG. 18a is a plan view, FIG. 18b is a cross-sectional view taken at a sectional plane B—B' of FIG. 18a, FIG. 18c is a cross-sectional view taken at a sectional plane C—C' of FIG. 18a, FIG. 18d is a cross-sectional view taken at s sectional plane D—D' of FIG. 18a, FIG. 18e is a cross-sectional view taken at a sectional plane E—E' of FIG. 18a. FIG. 18f and FIG. 18g are perspective views showing knock down configurations of the silicon single crystal part of the device and silicon polycrystalline part of the same, respectively.

As shown in FIG. 18a through FIG. 18g, on a p-type substrate 1501, a high resistivity n-type region 1502, a p-type region 1503 which constitutes read-out gate electrode regions, n+-type region 1504 are made. And from the surface of the n+-type region 1504 downward substantially vertically, oblong grooves 511 of width W and depth H are formed in one direction. Immediately under the bottom face of respective grooves 511, p+-type channel stopper regions 1505 are made. After making insulation films 1506 in the grooves 511, first polysilicon gate electrodes 1507, which constitute signal transmission lines, are made in a buried manner; and after making another insulation film thereon, second polysilicon gate electrodes 1508, which constitute read-out gate electrodes, are made. FIG. 18f and FIG. 18g show the silicon single crystal part and silicon polycrystalline part of the resultant device, but excluding the oxide film 1506 for simplicity of illustration.

The operation of this tenth embodiment can be considered as what is developed into a two dimensional manner from the ninth embodiment, and electron charges are transported in depletion regions 1511 and 1512 formed in the n-type regions 1502. The principal difference of this embodiment over the preceding ninth embodiment is that the read-out gate electrodes 1508 are formed above the side walls of the grooves 511, the semiconductor device can be highly integrated, and manufacturing process is easier than the ninth embodiment of FIG. 17a through FIG. 17f.

FIG. 19a, FIG. 19b, FIG. 19c, FIG. 19d, FIG. 19e, FIG. 19f, FIG. 19g-1, FIG. 19g-2, FIG. 19h, FIG. 19i, FIG. 19j-1, FIG. 19j-2, FIG. 19k, FIG. 19l, FIG. 19m-1, FIG. 19m-2, FIG. 19n-1 and FIG. 19n-2 show the manufacturing steps of the semiconductor device shown in FIG. 18a through FIG. 18f. The manufacturing steps are described in detail with reference to FIG. 18a throguh n-1.

Figure 19A:
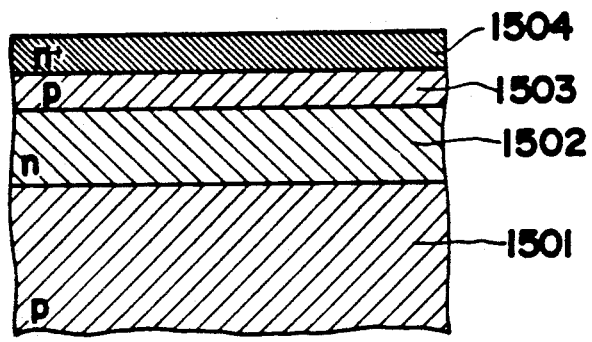

(1) First, as shown in FIG. 19a, on the p-type semiconductor substrate 1501, the high-resistivity n-type region (having impurity concentration N of $N<10^{15} cm^{-3}$), is formed by vapor phase growth or the like process. Then, p-type regions 1503 (having impurity concentration N of $10^{15}<N<10^{17} cm^{-3}$), n+-type region 1504 (having impurity concentration N of $10^{17}<N<10^{19} cm^{-3}$) are made by diffusion or vapor phase growth or ion-implantation method. Alternatively, the p-type region 1503 may be made by ion-implantation, after making the n+-type region preliminarily.

Figure 19B:
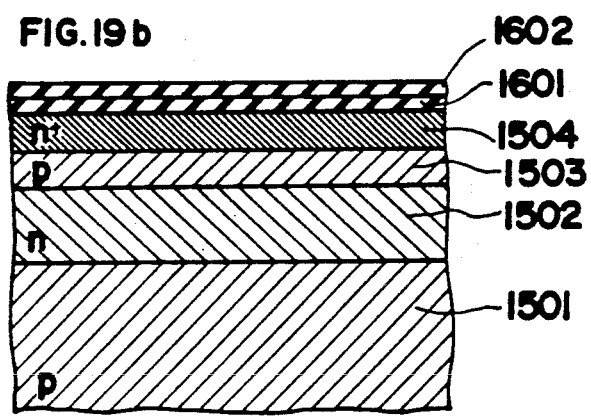

(2) As shown in FIG. 19b, on the surface of the n+-type region 1504, oxide film 1601 (of thickness of about 1000 Å) and nitride film 1602 (of thickness t of $1000 Å<t<2,000 Å$) are formed by thermal oxidation and CVD method respectively.

Figure 19C:
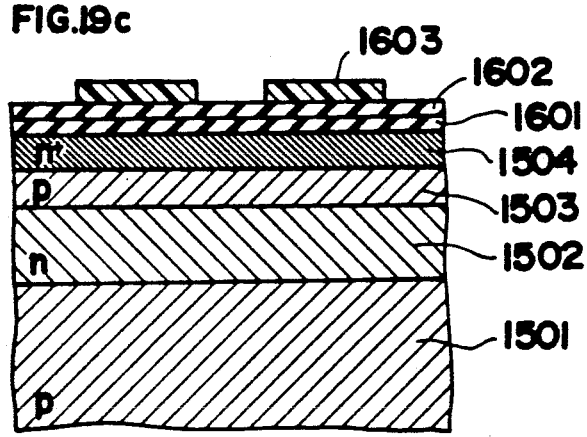
Figure 19:
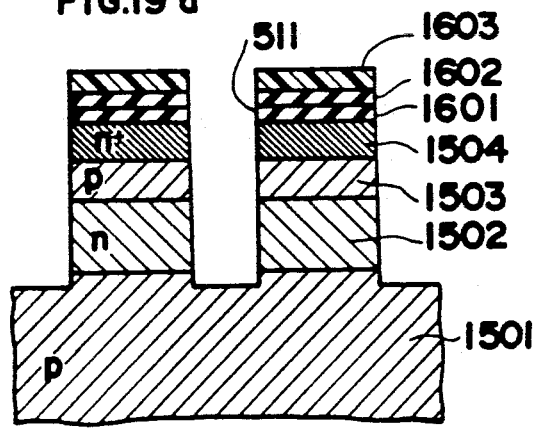
Figure 19:
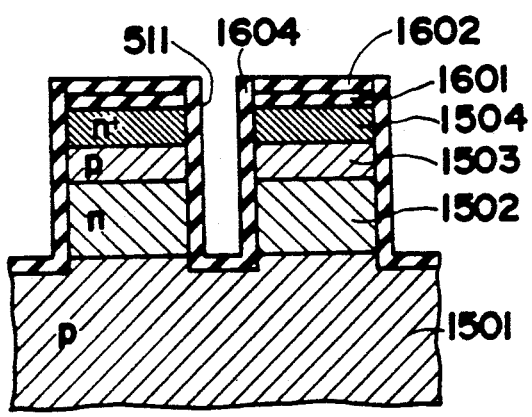
Figure 19:
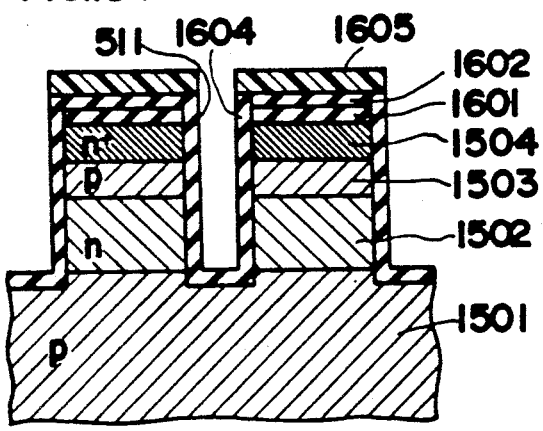
Figure 19:
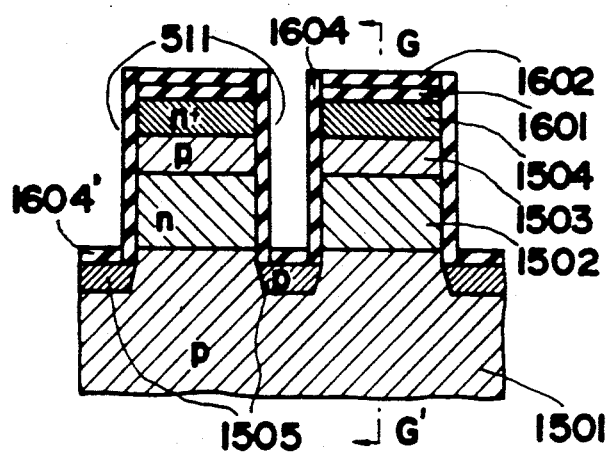
Figure 19:
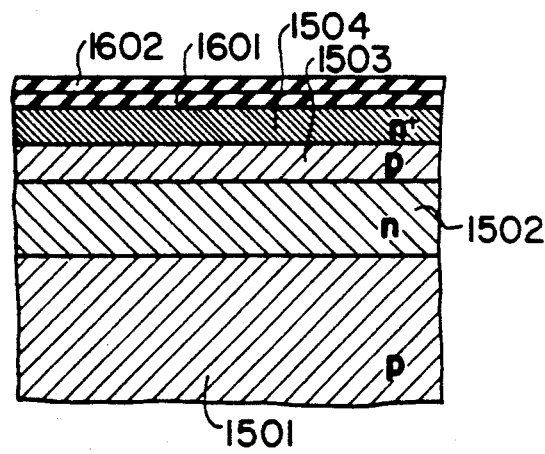
Figure 19:
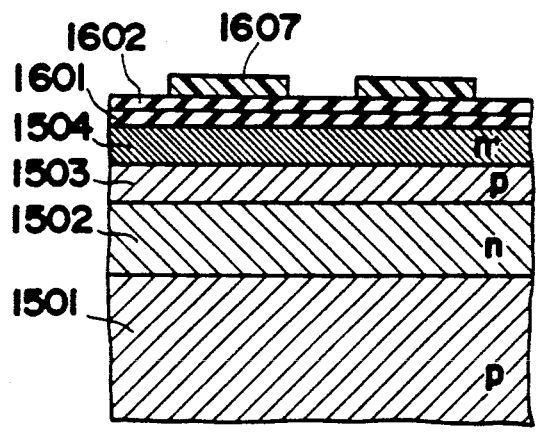
Figure 19:
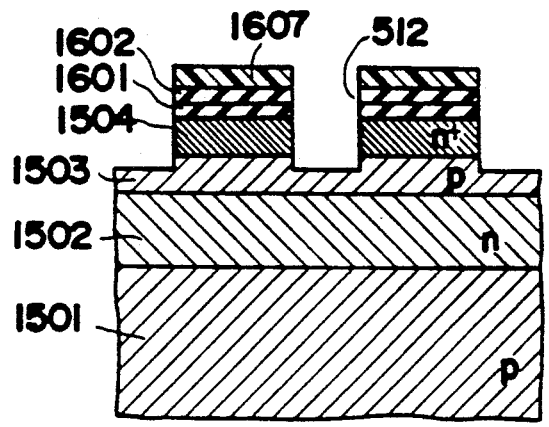
Figure 19:
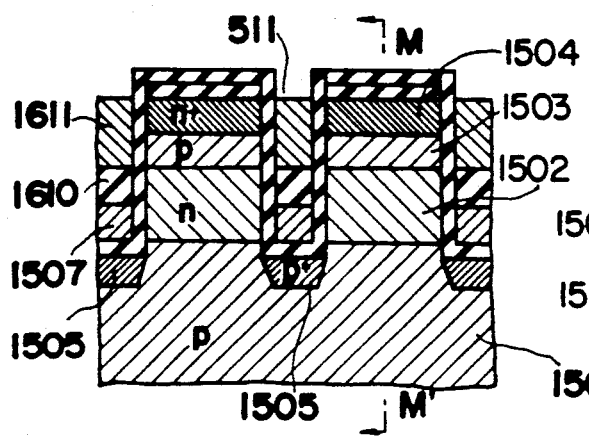
Figure 19:
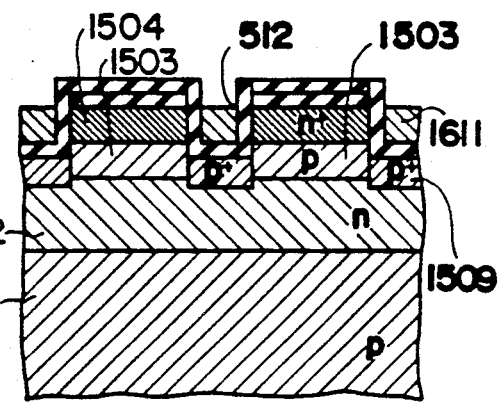
Figure 19:
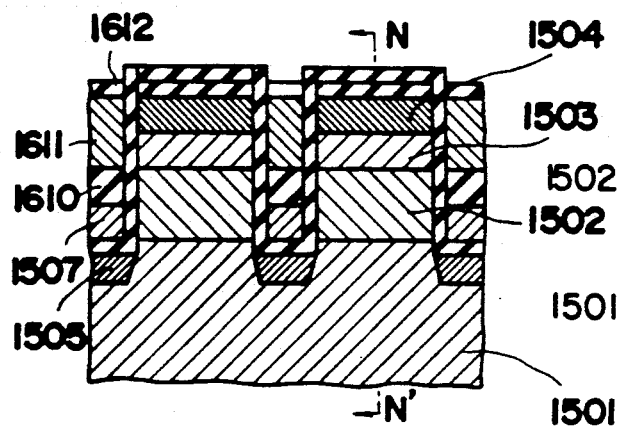
Figure 19:
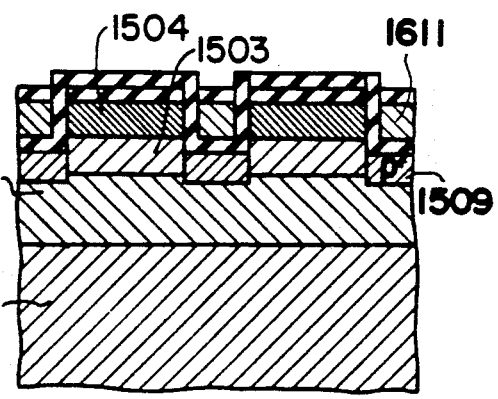

(3) As shown in FIG. 19c, photoresist film 1603 is formed by ordinary photolithographic technology.

(4) As shown in FIG. 19d, by means of plasma etching, sputter etching or chemical etching, the nitride film 1602 snd the oxide film 1601 are removed, and then, by directional etching, the n+-type region 1504, the p-type region 1503 and the n-type region 1502 are removed to make grooves 511 in a manner that vertical side walls of grooves 511 made by the etching become substantially perpendicular to the principal surface. Alkaline etching or plasma etching is used as the directional etching.

(5) As shown in FIG. 19e, oxide film 1604 is formed by thermal oxidation or the like process to cover the surface of the etched groove 511 made by the etching step of FIG. 19d.

(6) As shown in FIG. 19f, another photoresist 1605 is formed by ordinary photolithographic technology; and thereafter, by the same process as described in the step (4), the oxide film 1604 at the bottom part of the etched groove 511 is formed.

(7) As shown in FIG. 19g-1, after removing the photoresist 1605, a p+-type region 1505 of concentration N of $N<10^{20} cm^{-3}$ is formed by diffusion or ion-implantation under the botom of the groove 511. Thereafter, the oxide film 1604' is made by thermal oxidation or the like method. FIG. 19g-2 show cross-section taken by a sectional plane G—G' on FIG. 19g-1.

(8) Then, as shown in FIG. 19h, the photoresist film 1607 is made by oridnary photolithographic technology.

(9) As shown in FIG. 19i, by using the step (4) described above, the substrate is subject to directional etching upto midway deep in the n-type region 1502 to make groove 512 in a manner that side walls thereof are substantially perpendicular to the principal face of the substrate.

(10) As shown in FIG. 19j-1, the oxide film 1608 is made on the inside faces of the groove 512 by thermal oxidation or the like process. FIG. 19j-2 shows a cross-section taken by a cross-sectional phase J—J' on FIG. 19j-1.

(11) As shown in FIG. 19k, the first polysilicon region 1507 is filled in the groove 511. This can be made, for instance by a process such that polyimide film is applied on all the surface, and then photoresist is applied and a patterning thereof is made, the polyimide film at the part of the groove 511 is etched away, and the first polysilicon 1507 is filled by sputtering or CVD.

(12) As shown in FIG. 19l, oxide film 1610 is formed by thermal oxidation or the like process.

(13) As shown in FIG. 19m-1, by using the method of the step (11), the second polysilicon region 1611 is filled in the rest of grooves 511. FIG. 19m-2 shows a cross-section taken by a cross-sectional plane M—M' on FIG. 19m-1.

(14) As shown in FIG. 19n-1, oxide film 1612 is made on the second polysilicon region 1611 by thermal oxidation or the like process. FIG. 19n-2 shows a cross-section taken by a cross-sectional plane N—N' on FIG. 19n-1.

Thereafter, polyimide is coated on all the surface of the substrate as an insulator, to complete the MOS type imaging device shown by FIG 18a through FIG. 18f.

Figure 20:
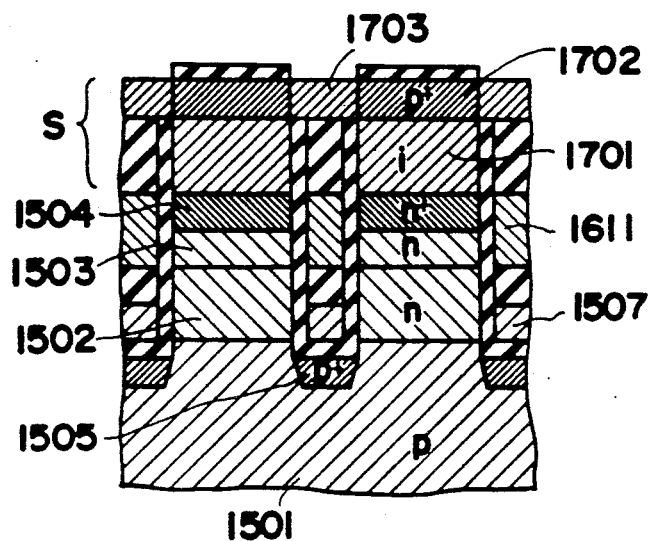
FIG. 20 shows an embodiment modified from that of FIG. 18a through 18g.

FIG 20 shows an embodiment modified from that of FIG. 18a through 18g. In this modified embodiment, pin photo-diodes S are formed as photoelectric conversion parts of the MOS imaging device. The pin photo-diodes S comprises n+-type region 1504, i-type region 1701, p+-type region 1702 and metal electrode 1703.

Figure 21:
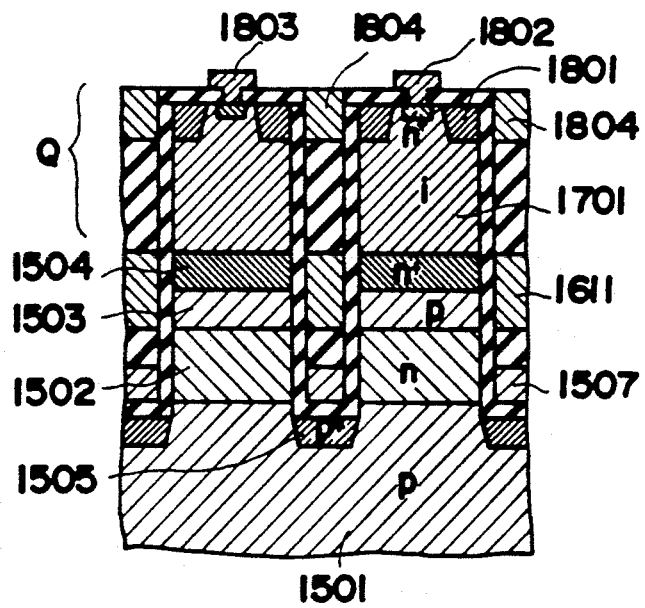
FIG. 21 is a cross-sectional view of a still modified example.

As a further modified embodiment, as shown in FIG. 21, known SIT (Static Induction Transistor) phototransistors Q may be used as the photo-electric conversion parts. In FIG. 21, the SIT photo-transistor comprises p+-type gate regions 1801, n+-type source regions 1802, source electrodes of metal 1803 and gate electrodes 1804 of polysilicon.

As has been described concerning many embodiments from FIG. 14a to FIG. 21, according to the present invention a MOS type image pick-up device, which has no contacts in light-receiving parts and that has flat surface construction, is obtainable by configuring to store electric charges in depletion regions at the vicinity of grooves. As a result of the above-mentioned configuration, high production yield is achieved. Further, low noise operation is obtainable since the electrons of signal charges move in the semiconductor device without crossing the surface thereof.

What is claimed is:

1. A charge coupled device for a soild state image pick-up device comprising:
   a semiconductor layer of a second conductivity type having plural first oblong grooves in one direction, and plural second oblong grooves perpendicular to and crossing said first oblong grooves, said first oblong grooves being deeper in said semiconductor layer than said second oblong grooves;

an insulation film formed on side walls of said first and second grooves and a surface of said semiconductor layer:

plural stacks each comprising a photoelectric conversion region of a first conductivity type and a read-out gate region of said second conductivity type which are two-dimensionally formed in said semiconductor layer, underneath said isulation film and among said first and second oblong grooves;

plural oblong charge conveying regions of said first conductivity type for conveying signal charge regions which are formed in said semiconductor layer, underneath said read-out gate regions and among said first oblong grooves in a longitudinal direction of said first oblong grooves; and plural gate electrodes formed in said first oblong grooves without overlapping each other.

* * * * *